United States Patent
Lu et al.

(10) Patent No.: US 9,679,906 B2
(45) Date of Patent: Jun. 13, 2017

(54) THREE-DIMENSIONAL MEMORY DEVICES CONTAINING MEMORY BLOCK BRIDGES

(71) Applicant: SANDISK TECHNOLOGIES INC., Plano, TX (US)

(72) Inventors: Zhenyu Lu, Milpitas, CA (US); Johann Alsmeier, San Jose, CA (US); Daxin Mao, Cupertino, CA (US); Wenguang Shi, Milpitas, CA (US); Sateesh Koka, Milpitas, CA (US); Raghuveer S. Makala, Campbell, CA (US); George Matamis, Danville, CA (US); Yao-Sheng Lee, Tampa, FL (US); Chun Ge, San Jose, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 14/823,274

(22) Filed: Aug. 11, 2015

(65) Prior Publication Data

US 2017/0047334 A1 Feb. 16, 2017

(51) Int. Cl.
*H01L 27/115* (2017.01)
*H01L 27/1157* (2017.01)
(Continued)

(52) U.S. Cl.
CPC .... *H01L 27/1157* (2013.01); *H01L 27/11524* (2013.01); *H01L 27/11556* (2013.01); *H01L 27/11582* (2013.01)

(58) Field of Classification Search
None
See application file for complete search history.

(56) References Cited

U.S. PATENT DOCUMENTS

| 5,915,167 A | 6/1999 | Leedy |
| 2014/0014889 A1* | 1/2014 | Shim ................ H01L 29/7827 257/1 |
| 2014/0191388 A1 | 7/2014 | Chen et al. |

OTHER PUBLICATIONS

The International Search Report and Written Opinion of the International Searching Authority for International Application No. PCT/US2016/036326, dated Oct. 6, 2016, 16 Pages.

(Continued)

*Primary Examiner* — Angel Roman
*Assistant Examiner* — Kevin Quinto
(74) *Attorney, Agent, or Firm* — The Marbury Law Group PLLC

(57) ABSTRACT

A monolithic three-dimensional memory device includes a first memory block containing a plurality of memory sub-blocks located on a substrate. Each memory sub-block includes a set of memory stack structures and a portion of alternating layers laterally surrounding the set of memory stack structures. The alternating layers include insulating layers and electrically conductive layers. A first portion of a neighboring pair of memory sub-blocks is laterally spaced from each other along a first horizontal direction by a backside contact via structure. A subset of the alternating layers contiguously extends between a second portion of the neighboring pair of memory sub-blocks through a gap in a bridge region between two portions of the backside contact via structure that are laterally spaced apart along a second horizontal direction to provide a connecting portion between the neighboring pair of memory sub-blocks.

18 Claims, 38 Drawing Sheets

(51) Int. Cl.
*H01L 27/11582* (2017.01)
*H01L 27/11524* (2017.01)
*H01L 27/11556* (2017.01)

(56) References Cited

OTHER PUBLICATIONS

Endoh et al., "Novel Ultra High Density Memory with a Stacked-Surrounding Gate Transistor (S-SGT) Structured Cell," IEDM Proc., (2001), 33-36.
U.S. Appl. No. 14/491,026, filed Sep. 19, 2014, SanDisk Technologies Inc.
U.S. Appl. No. 14/462,209, filed Aug. 18, 2014, SanDisk Technologies Inc.
U.S. Appl. No. 14/491,315, filed Sep. 19, 2014, SanDisk Technologies Inc.
Invitation to Pay Additional Fees, and Communication Relating to the Results of the Partial International Search for International Application No. PCT/US2016/036326, dated Aug. 11, 2016, 7 Pages.

\* cited by examiner

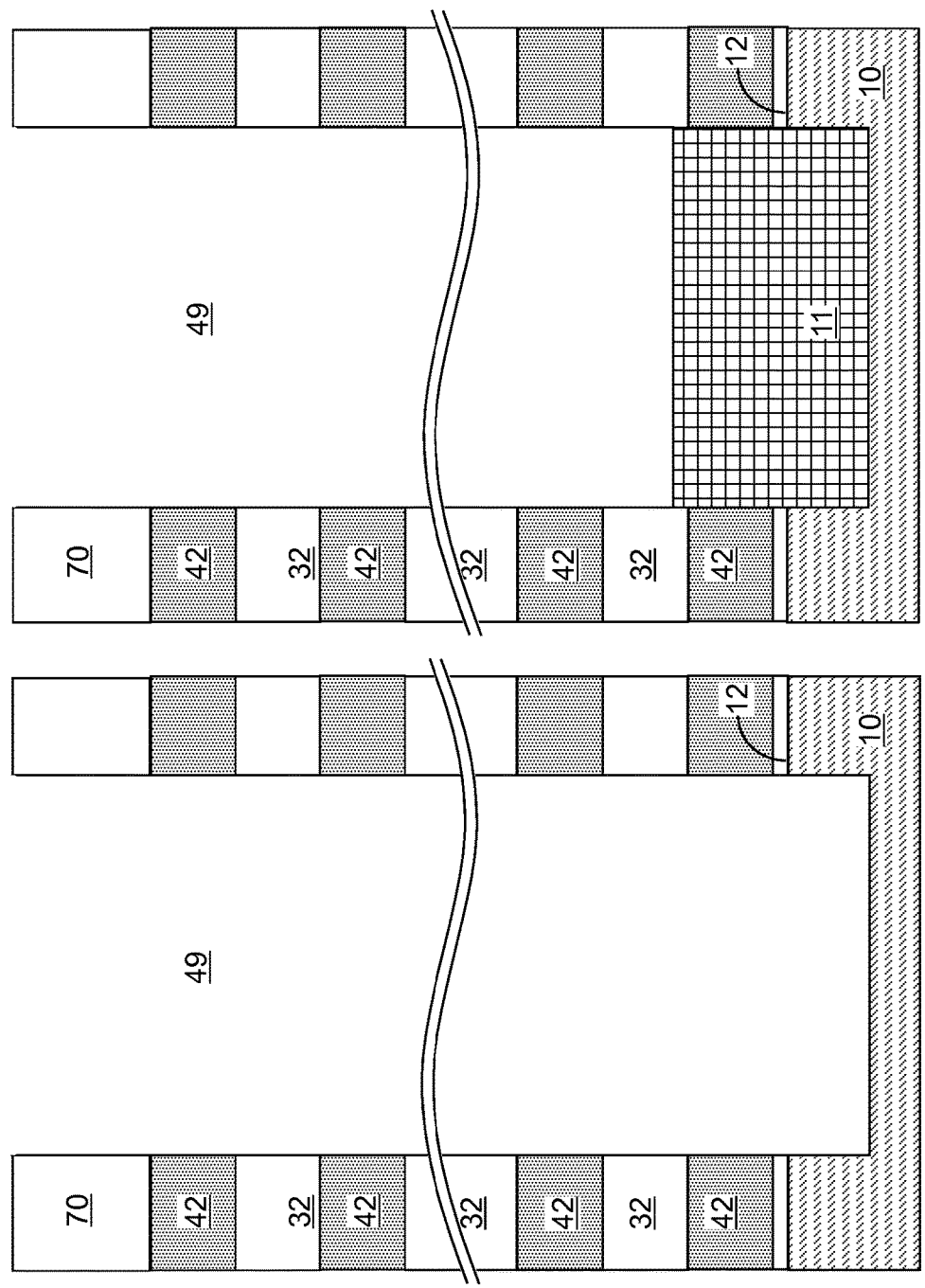

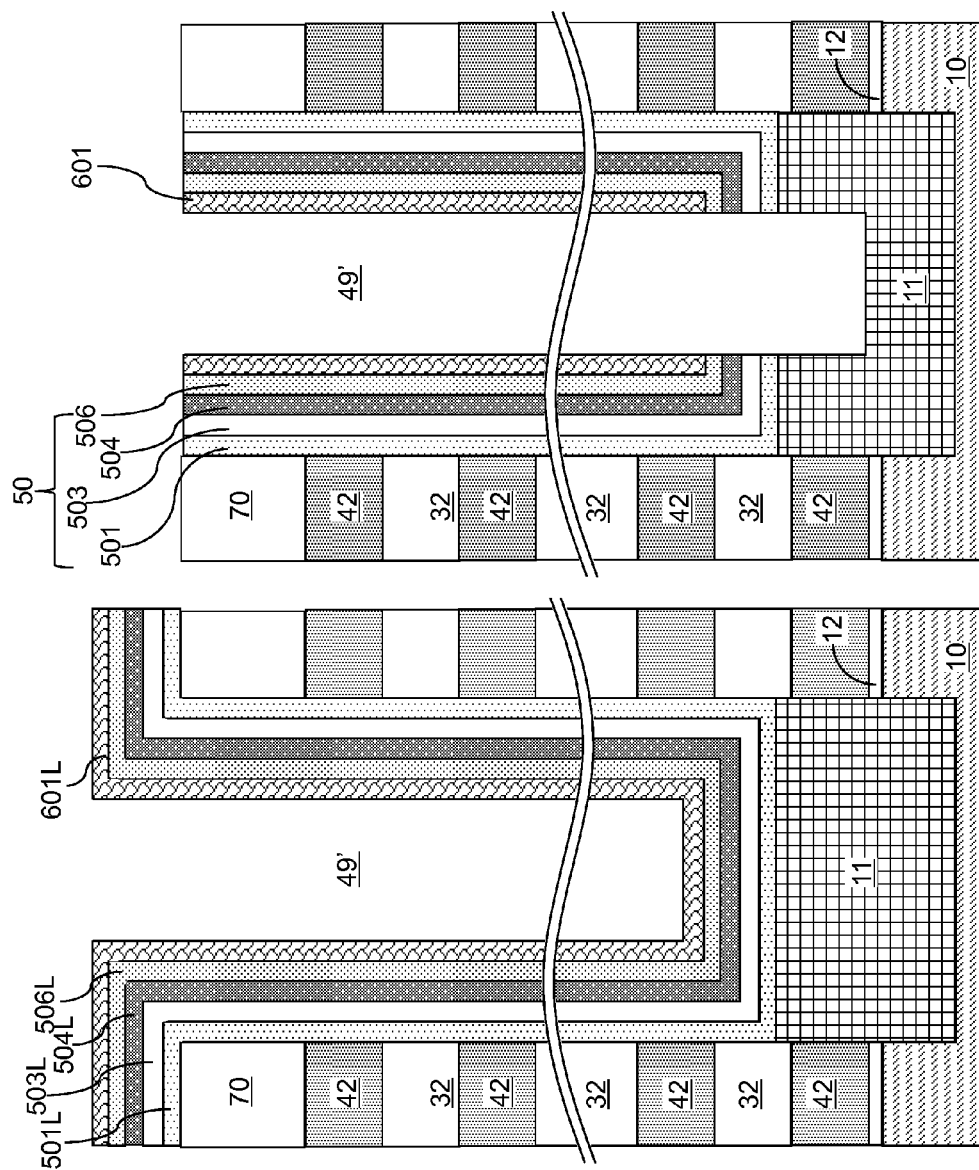

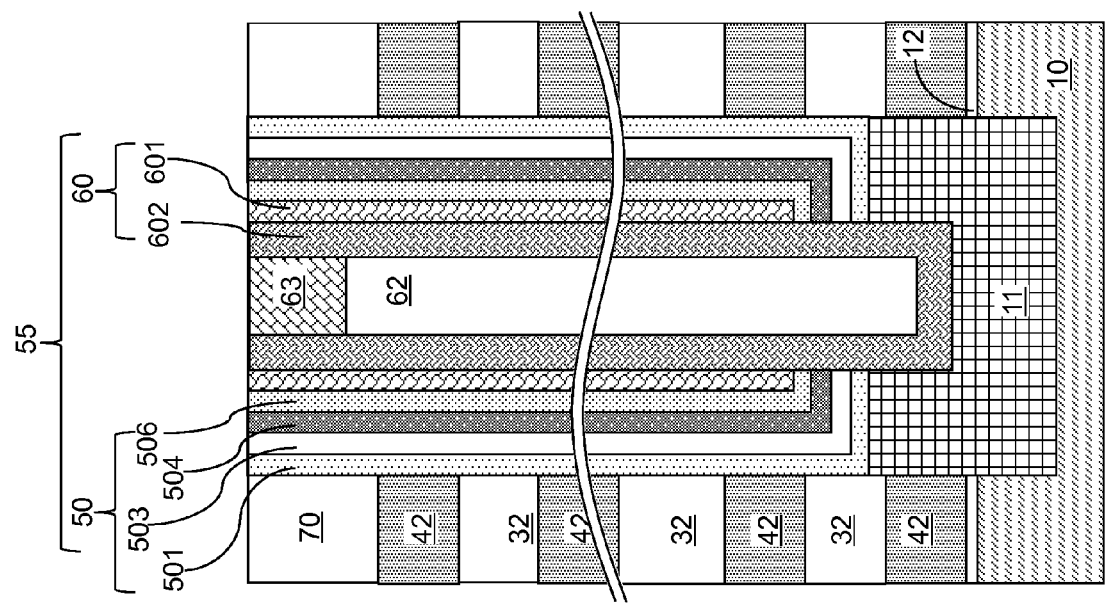
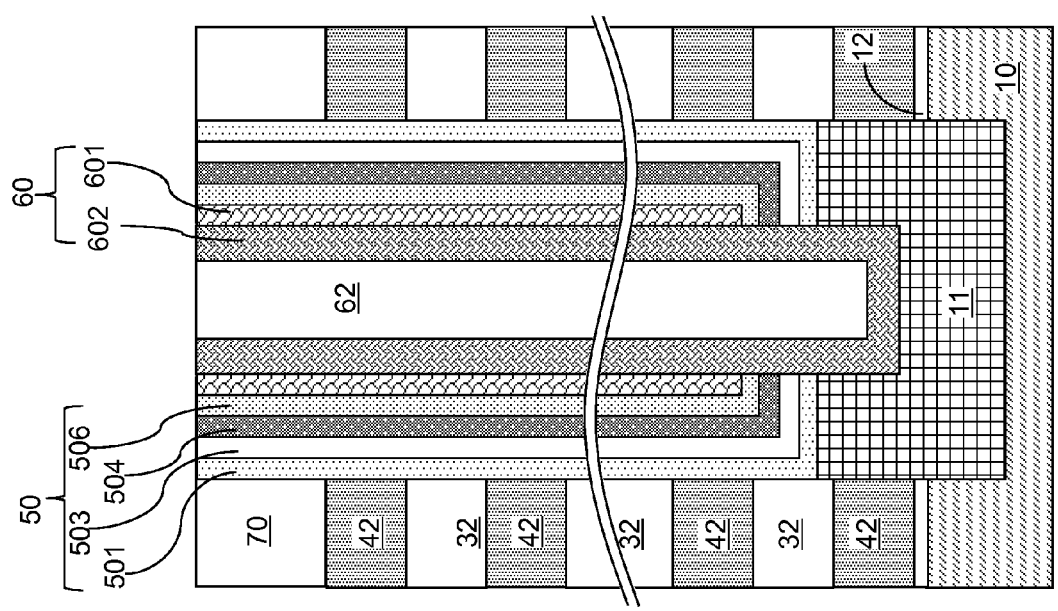

THREE-DIMENSIONAL MEMORY DEVICES CONTAINING MEMORY BLOCK BRIDGES

FIELD

The present disclosure relates generally to the field of semiconductor devices and specifically to three-dimensional semiconductor devices, such as vertical NAND strings, and methods of making thereof.

BACKGROUND

Three-dimensional vertical NAND strings having one bit per cell are disclosed in an article by T. Endoh, et. al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a monolithic three-dimensional memory device includes a first memory block containing a plurality of memory sub-blocks located on a substrate. Each memory sub-block includes a set of memory stack structures and a portion of alternating layers laterally surrounding the set of memory stack structures. The alternating layers include insulating layers and electrically conductive layers. A first portion of a neighboring pair of memory sub-blocks is laterally spaced from each other along a first horizontal direction by a backside contact via structure. A subset of the alternating layers contiguously extends between a second portion of the neighboring pair of memory sub-blocks through a gap in a bridge region between two portions of the backside contact via structure that are laterally spaced apart along a second horizontal direction to provide a connecting portion between the neighboring pair of memory sub-blocks.

According to another aspect of the present disclosure, a method of manufacturing a memory device is provided. The method includes forming a stack of alternating layers comprising insulating layers and spacer material layers over a substrate, forming memory stack structures in the stack of alternating layers and forming a backside contact trench. The backside contact trench comprises first and second portions in which a top surface of the substrate is physically exposed such that the first and second portions are separated by gap filled by a subset of the alternating layers. The method also comprises forming a backside contact via structure within the backside contact trench such that a first portion of the backside contact via structure in the first portion of the backside contact trench is electrically connected to a second portion of the backside contact via structure located in the second portion of the backside contact trench.

BRIEF DESCRIPTION OF THE DRAWINGS

FIGS. 2A-2H are sequential vertical cross-sectional views of a memory opening within the exemplary structure during various processing steps employed to form a memory stack structure according to an embodiment of the present disclosure.

DETAILED DESCRIPTION

Figure 1A:
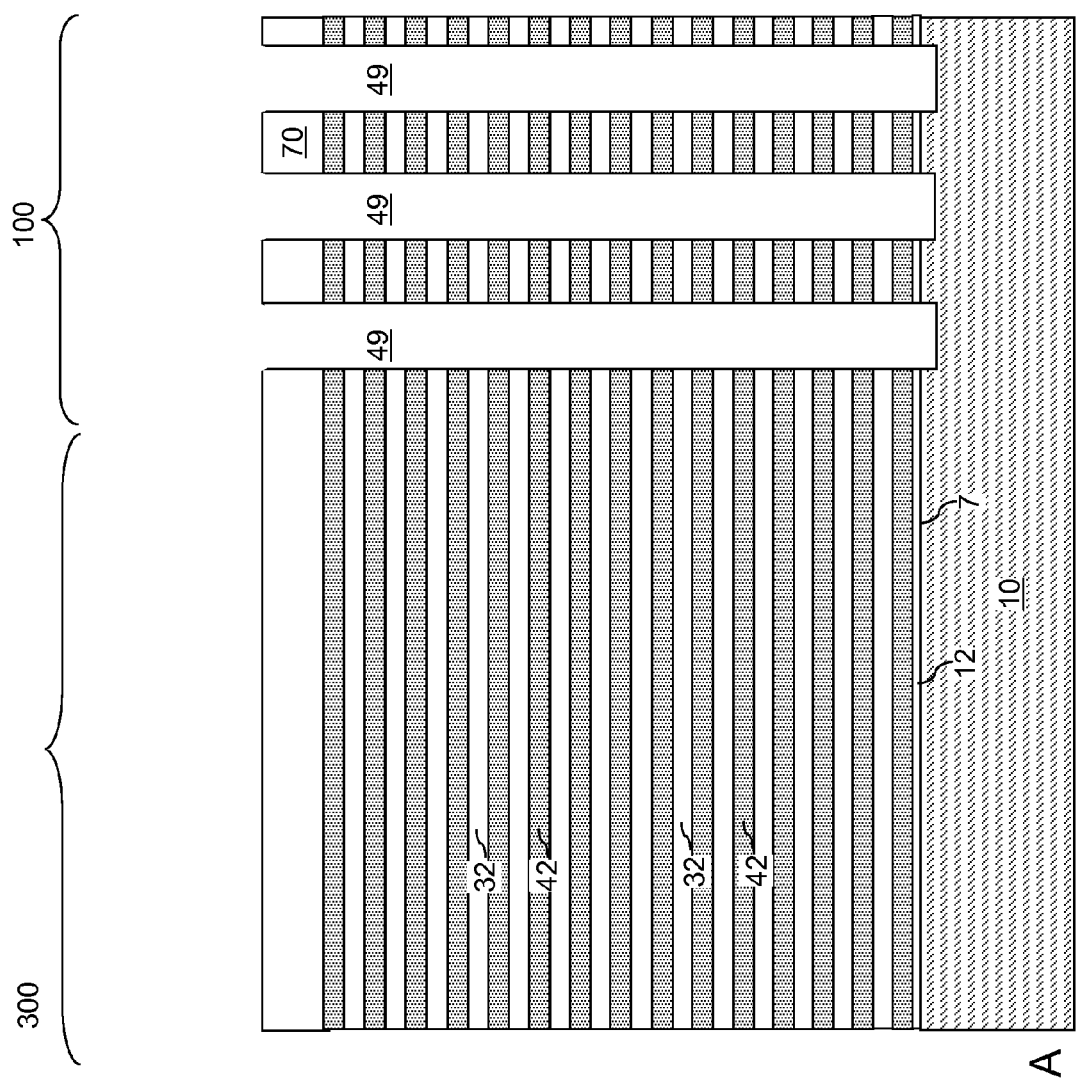
FIG. 1A is a vertical cross-sectional view of an exemplary structure after formation of a stack including an alternating plurality of material layers and memory openings extending through the stack according to an embodiment of the present disclosure.

As discussed above, the present disclosure is directed to three-dimensional memory structures, such as vertical NAND strings and other three-dimensional devices, and methods of making thereof, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a substantially uniform thickness. A layer may extend over the entirety of an underlying or overlying structure, or may have an extent less than the extent of an underlying or overlying structure. Further, a layer may be a region of a homogeneous or inhomogeneous contiguous structure that has a thickness less than the thickness of the contiguous structure. For example, a layer may be located between any pair of horizontal planes between, or at, a top surface and a bottom surface of the contiguous structure. A layer may extend horizontally, vertically, and/or along a tapered surface. A substrate may be a layer, may include one or more layers therein, and/or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Figure 1B:
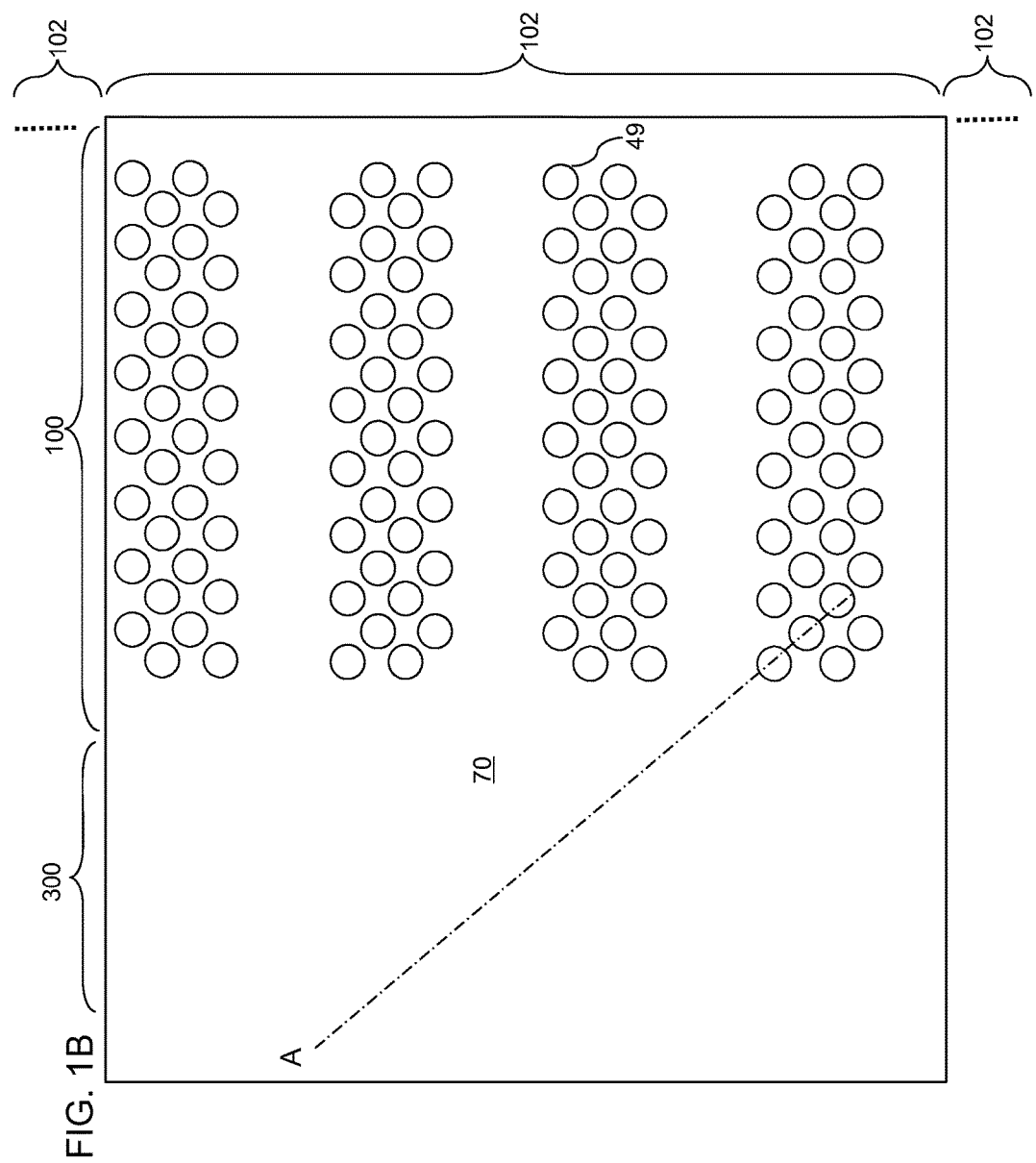
FIG. 1B is a top-down view of the exemplary structure of FIG. 1A according to an embodiment of the present disclosure. The vertical plane A-A' corresponds to the plane of the vertical cross-sectional view of FIG. 1A.

Referring to FIGS. 1A and 1B, an exemplary structure according to an embodiment of the present disclosure is illustrated, which can be employed, for example, to fabricate a device structure containing vertical NAND memory devices. The exemplary structure includes a substrate, which can be a semiconductor substrate. The substrate can include a semiconductor material layer 10. The semiconductor material layer 10 is a semiconductor material layer, and can include at least one elemental semiconductor material, at least one III-V compound semiconductor material, at least one II-VI compound semiconductor material, at least one organic semiconductor material, or other semiconductor materials known in the art. The substrate can have a major surface 7, which can be, for example, a topmost surface of the semiconductor material layer 10. The major surface 7 can be a semiconductor surface. In one embodiment, the major surface 7 can be a single crystalline semiconductor surface.

As used herein, a "semiconductor material" refers to a material having electrical conductivity in the range from $1.0\times10^{-6}$ S/cm to $1.0\times10^{5}$ S/cm, and is capable of producing a doped material having electrical conductivity in a range from 1.0 S/cm to $1.0\times10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0\times10^{5}$ S/cm. As used herein, an "insulator material" or a "dielectric material" refers to a material having electrical conductivity less than $1.0\times10^{-6}$ S/cm. All measurements for electrical conductivities are made at the standard condition. Optionally, at least one doped well (not expressly shown) can be formed within the semiconductor material layer 10.

At least one semiconductor device for a peripheral circuitry (not shown) can be formed on a portion of the semiconductor material layer 10. The at least one semiconductor device can include, for example, field effect transistors. For example, at least one shallow trench isolation structure (not shown) can be formed by etching portions of the semiconductor material layer 10 and depositing a dielectric material therein. Additional device components (not shown), such as a gate dielectric layer, at least one gate conductor layer, and a gate cap dielectric layer, can be formed over the semiconductor material layer 10, and can be subsequently patterned to form at least one gate structure (not shown), each of which can include, for example, a gate dielectric, at least one gate electrode, and a gate cap dielectric. At least one gate spacer (not shown) can be formed around the at least one gate structure by depositing and anisotropically etching a conformal dielectric layer. Active regions (such as source regions and drain regions) can be formed in upper portions of the semiconductor material layer 10, for example, by introducing electrical dopants employing the at least one gate structure as masking structures. Additional masks may be employed as needed. The least one semiconductor device for the peripheral circuitry can contain a driver circuit for memory devices to be subsequently formed, which can include at least one NAND device. The portion of the semiconductor material layer 10 on which the semiconductor devices of the peripheral circuitry are formed may, or may not, be recessed with respect to the top surface of the semiconductor material layer 10. Further, formation of the semiconductor devices of the peripheral circuitry may be performed after formation of memory stack structures in a subsequent step, and may employ a raised epitaxial pedestal that can be formed over a top surface of the semiconductor material layer 10. Optionally, a planarization dielectric layer (not shown) may be employed to provide a planar surface after formation of the semiconductor devices.

At least a portion of the semiconductor material layer 10 located in the device region 100 is a doped well. As used herein, a "doped well" refers to a portion of a semiconductor material having a doping of a same conductivity type (which can be p-type or n-type) and a substantially same level of dopant concentration throughout. The doped well can be the same as the semiconductor material layer 10 or can be a portion of the semiconductor material layer 10. The conductivity type of the doped well is herein referred to as a first conductivity type, which can be p-type or n-type. The dopant concentration level of the doped well is herein referred to as a first dopant concentration level. In one embodiment, the first dopant concentration level can be in a range from $1.0 \times 10^{15}/cm^3$ to $1.0 \times 10^{18}/cm^3$, although lesser and greater dopant concentration levels can also be employed. As used herein, a dopant concentration level refers to average dopant concentration for a given region.

Optionally, a gate dielectric layer 12 can be formed above the semiconductor material layer 10. The gate dielectric layer 12 can be employed as the gate dielectric for a source select gate electrode. The gate dielectric layer 12 can include, for example, silicon oxide and/or a dielectric metal oxide (such as $HfO_2$, $ZrO_2$, $LaO_2$, etc.). The thickness of the gate dielectric layer 12 can be in a range from 3 nm to 30 nm, although lesser and greater thicknesses can also be employed.

A stack of an alternating plurality of first material layers (which can be insulating layers 32) and second material layers (which are referred to as spacer material layers) is formed over the top surface of the substrate, which can be, for example, on the top surface of the gate dielectric layer 12. As used herein, a "material layer" refers to a layer including a material throughout the entirety thereof. As used herein, a "spacer material layer" refers to a material layer that is located between two other material layers, i.e., between an overlying material layer and an underlying material layer. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality. The spacer material layers can be formed as electrically conductive layers, or can be replaced with electrically conductive layers in a subsequent processing step.

Each first material layer includes a first material, and each second material layer includes a second material that is different from the first material. In one embodiment, each first material layer can be an insulating layer 32, and each second material layer can be a sacrificial material layer 42. In this case, the stack can include an alternating plurality of insulating layers 32 and sacrificial material layers 42, and constitutes a prototype stack of alternating layers comprising insulating layers 32 and sacrificial material layers 42. As used herein, a "prototype" structure or an "in-process" structure refers to a transient structure that is subsequently modified in the shape or composition of at least one component therein.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Subsequently, a lithographic material stack (not shown) including at least a photoresist layer can be formed over the insulating cap layer 70 and the alternating stack (32, 42), and can be lithographically patterned to form openings therein. The pattern in the lithographic material stack can be transferred through the insulating cap layer 70 and through entirety of the alternating stack (32, 42) by at least one anisotropic etch that employs the patterned lithographic material stack as an etch mask. Portions of the alternating stack (32, 42) underlying the openings in the patterned lithographic material stack are etched to form memory openings 49. In other words, the transfer of the pattern in the patterned lithographic material stack through the alternating stack (32, 42) forms the memory openings 49 that extend through the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. Optionally, the gate dielectric layer 12 may be used as an etch stop layer between the alternating stack (32, 42) and the substrate. The sidewalls of the memory openings 49 can be substantially vertical, or can be tapered. The patterned lithographic material stack can be subsequently removed, for example, by ashing.

The memory openings 49 can be formed as multiple clusters within a region, which is herein referred to as a device region 100. A contact region 300 is provided adjacent to the memory region for subsequently providing electrical contacts to electrically conductive layers that are formed as the second material layers 42, or to replace the second material layers 42 in case the second material layers 42 are formed as sacrificial material layers. Each cluster of the memory openings 49 corresponds to a subset of memory openings that belongs to a same sub-block within the same memory block 102. As used herein, a "memory block" 102 refers to a physical region in which memory stack structures that share the same word line/control gate electrode in each device level. As will be described below, the layers in the stack in adjacent memory blocks are separated by backside contact trenches filled with backside contact via structures (e.g., source electrode or source side local interconnect) without a bridge region connecting the stack layers in adjacent memory block. As will be further described below, the portions of layers in the stack in adjacent memory sub-blocks in the same memory block are separated by the backside contact trenches filled with backside contact via structures with one or more bridge regions connecting the stack layers in adjacent memory sub-blocks.

The memory openings 49 are formed through the gate dielectric layer 12 so that the memory openings 49 extend from the top surface of the alternating stack (32, 42) to the top surface of the semiconductor material layer 10 within the substrate between the lower select gate electrodes. In one embodiment, an overetch into the semiconductor material layer 10 may be optionally performed after the top surface of the semiconductor material layer 10 is physically exposed at a bottom of each memory opening 49. The overetch may be performed prior to, or after, removal of the lithographic material stack. In other words, the recessed surfaces of the semiconductor material layer 10 may be vertically offset from the undressed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surface of each memory opening 49 can be coplanar with the topmost surface of the semiconductor material layer 10. Each of the memory openings 49 can include a sidewall (or a plurality of sidewalls) that extends substantially perpendicular to the topmost surface of the substrate. The region in which the array of memory openings 49 is formed is herein referred to as a device region. The semiconductor material layer 10 constitutes a substrate 10, which can be a semiconductor substrate. Alternatively, the semiconductor material layer 10 may be omitted, and the memory openings 49 can be extend to a top surface of the semiconductor material layer 10.

A memory stack structure can be formed in each of the memory opening employing various embodiments of the present disclosure. FIGS. 2A-2H illustrate sequential vertical cross-sectional views of a memory opening within the exemplary structure during formation of an exemplary memory stack structure according to a embodiment of the present disclosure. Formation of the exemplary memory stack structure can be performed within each of the memory openings 49 in the exemplary structure illustrated in FIG. 1.

Referring to FIG. 2A, a memory opening 49 in the exemplary structure of FIG. 1 is illustrated in a magnified view. The memory opening 49 extends through the insulating cap layer 70, the alternating stack (32, 42), the gate dielectric layer 12, and optionally into an upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 2B, an optional epitaxial channel portion 11 can be formed at the bottom portion of each memory opening 49, for example, by selective epitaxy. Each epitaxial channel portion 11 comprises a single crystalline semiconductor material in epitaxial alignment with the single crystalline semiconductor material of the semiconductor material layer 10. In one embodiment, the epitaxial channel portion 11 can be doped with electrical dopants of the same conductivity type as the semiconductor material layer 10. In one embodiment, the top surface of each epitaxial channel portion 11 can be formed above a horizontal plane including the top surface of a sacrificial material layer 42. In this case, at least one source select gate electrode can be subsequently formed by replacing each sacrificial material layer 42 located below the horizontal plane including the top surfaces of the epitaxial channel portions 11 with a respective conductive material layer.

Referring to FIG. 2C, a series of layers including at least one blocking dielectric layer (501L, 503L), a memory material layer 504L, a tunneling dielectric layer 506L, and an optional first semiconductor channel layer 601L can be sequentially deposited in the memory openings 49. The at least one blocking dielectric layer (501L, 503L) can include, for example, a first blocking dielectric layer 501L and a second blocking dielectric layer 503L.

The first blocking dielectric layer 501L can be deposited on the sidewalls of each memory opening 49 by a conformal deposition method. The first blocking dielectric layer 501L includes a dielectric material, which can be a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the first blocking dielectric layer 501L can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The first blocking dielectric layer 501L can be deposited, for example, by chemical vapor deposition (CVD), atomic layer deposition (ALD), pulsed laser deposition (PLD), liquid source misted chemical deposition, or a combination thereof. The thickness of the first blocking dielectric layer 501L can be in a range from 1 nm to 20 nm, although lesser and greater thicknesses can also be employed. The first blocking dielectric layer 501L can subsequently function as a dielectric material portion that blocks leakage of stored electrical charges to control gate electrodes. In one embodiment, the first blocking dielectric layer 501L includes aluminum oxide.

The second blocking dielectric layer 503L can be formed on the first blocking dielectric layer 501L. The second blocking dielectric layer 503L can include a dielectric material that is different from the dielectric material of the first blocking dielectric layer 501L. In one embodiment, the second blocking dielectric layer 503L can include silicon oxide (e.g., $SiO_2$), a dielectric metal oxide having a different composition than the first blocking dielectric layer 501L, silicon oxynitride, silicon nitride, or a combination thereof. In one embodiment, the second blocking dielectric layer 503L can include silicon oxide. The second blocking dielectric layer 503L can be formed by a conformal deposition method such as low pressure chemical vapor deposition, atomic layer deposition, or a combination thereof. The thickness of the second blocking dielectric layer 503L can be in a range from 1 nm to 20 nm, although lesser and greater thicknesses can also be employed. Alternatively, the first blocking dielectric layer 501L and/or the second blocking dielectric layer 503L can be omitted, and a blocking dielectric layer can be formed after formation of backside recesses on surfaces of memory films to be subsequently formed.

Subsequently, the memory material layer 504L, the tunneling dielectric layer 506L, and the optional first semiconductor channel layer 601L can be sequentially formed. In one embodiment, the memory material layer 504L can be a charge trapping material including a dielectric charge trapping material, which can be, for example, silicon nitride. Alternatively, the memory material layer 504L can include a conductive material such as doped polysilicon or a metallic material that is patterned into multiple electrically isolated portions (e.g., floating gates), for example, by being formed within lateral recesses into sacrificial material layers 42. In one embodiment, the memory material layer 504L includes a silicon nitride layer.

The memory material layer 504L can be formed as a single memory material layer of homogeneous composition, or can include a stack of multiple memory material layers. The multiple memory material layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the memory material layer 504L may comprise an insulating charge trapping material, such as one or more silicon nitride segments. Alternatively, the memory material layer 504L may comprise conductive nanoparticles such as metal nanoparticles, which can be, for example, ruthenium nanoparticles. The memory material layer 504L can be formed, for example, by chemical vapor deposition (CVD), atomic layer deposition (ALD), physical vapor deposition (PVD), or any suitable deposition technique for storing electrical charges therein. The thickness of the memory material layer 504L can be in a range from 2 nm to 20 nm, although lesser and greater thicknesses can also be employed.

The tunneling dielectric layer 506L includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 506L can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 506L can include a stack of a first silicon oxide layer, a silicon oxynitride layer, and a second silicon oxide layer, which is commonly known as an ONO stack. In one embodiment, the tunneling dielectric layer 506L can include a silicon oxide layer that is substantially free of carbon or a silicon oxynitride layer that is substantially free of carbon. The thickness of the tunneling dielectric layer 506L can be in a range from 2 nm to 20 nm, although lesser and greater thicknesses can also be employed.

The optional first semiconductor channel layer 601L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601L includes amorphous silicon or polysilicon. The first semiconductor channel layer 601L can be formed by a conformal deposition method such as low pressure chemical vapor deposition (LPCVD). The thickness of the first semiconductor channel layer 601L can be in a range from 2 nm to 10 nm, although lesser and greater thicknesses can also be employed. A cavity 49' is formed in the volume of each memory opening 49 that is not filled with the deposited material layers (501L, 503L, 504L, 506l, 601L).

Referring to FIG. 2D, the optional first semiconductor channel layer 601L, the tunneling dielectric layer 506L, the memory material layer 504L, the at least one blocking dielectric layer (501L, 503L) are sequentially anisotropically etched employing at least one anisotropic etch process. The portions of the first semiconductor channel layer 601L, the tunneling dielectric layer 506L, the memory material layer 504L, and the at least one blocking dielectric layer (501L, 503L) located above the top surface of the insulating cap layer 70 can be removed by the at least one anisotropic etch process. Further, the horizontal portions of the first semiconductor channel layer 601L, the tunneling dielectric layer 506L, the memory material layer 504L, and the at least one blocking dielectric layer (501L, 503L) at a bottom of each cavity 49' can be removed to form openings in remaining portions thereof. Each of the first semiconductor channel layer 601L, the tunneling dielectric layer 506L, the memory material layer 504L, and the at least one blocking dielectric layer (501L, 503L) can be etched by anisotropic etch process.

Each remaining portion of the first semiconductor channel layer 601L constitutes a first semiconductor channel portion 601. Each remaining portion of the tunneling dielectric layer 506L constitutes a tunneling dielectric 506. Each remaining portion of the memory material layer 504L is herein referred to as a charge storage element 504. In one embodiment, the charge storage element 504 can be a contiguous layer, i.e., can be a charge storage layer. Each remaining portion of the second blocking dielectric layer 503L is herein referred to as a second blocking dielectric 503. Each remaining portion of the first blocking dielectric layer 501L is herein referred to as a first blocking dielectric 501. A surface of the epitaxial channel portion 11 can be physically exposed underneath the opening through the first semiconductor channel portion 601, the tunneling dielectric 506, the charge storage element 504, and the at least one blocking dielectric (501, 503). If the epitaxial channel portion 11 is not present, a top surface of the semiconductor material layer 10 can be physically exposed underneath the memory cavity 49'. Optionally, the physically exposed portion of the epitaxial channel portion 11 can be vertically recessed. A tunneling dielectric 506 is surrounded by a charge storage element 504. The charge storage element 504 can comprise a charge trapping material or a floating gate material.

The set of the tunneling dielectric 506, the charge storage element 504, the second blocking dielectric 503, and the first blocking dielectric 501 collectively constitutes a memory film 50. In one embodiment, the first semiconductor channel portion 601, the tunneling dielectric 506, the charge storage element 504, the second blocking dielectric 503, and the first blocking dielectric 501 can have vertically coincident sidewalls. As used herein, a first surface is "vertically coincident" with a second surface if there exists a vertical plane including both the first surface and the second surface. Such a vertical plane may, or may not, have a horizontal curvature, but does not include any curvature along the vertical direction, i.e., extends straight up and down.

Figure 2E:
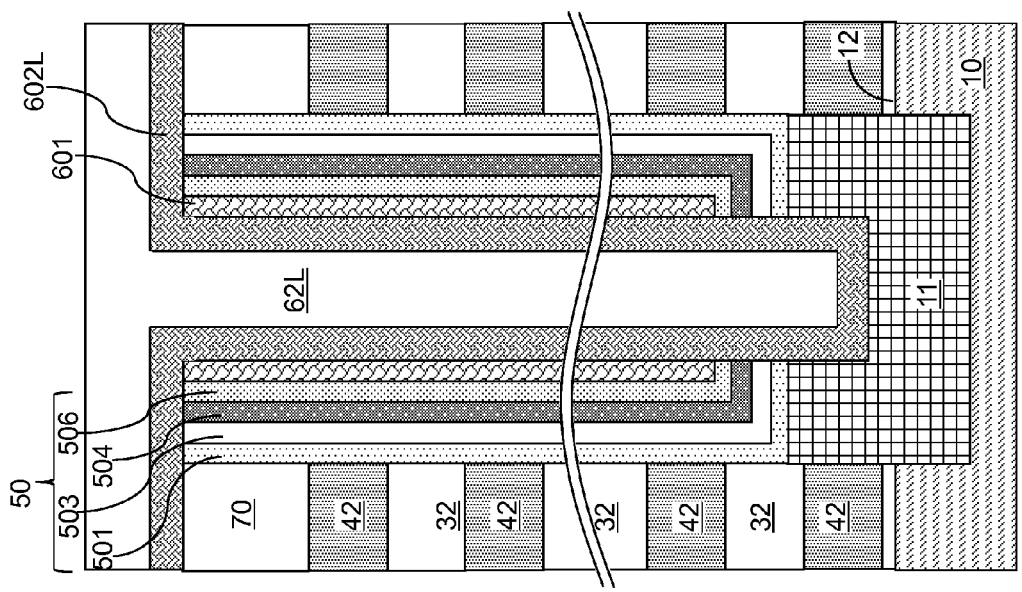

Referring to FIG. 2E, a second semiconductor channel layer 602L can be deposited directly on the semiconductor surface of the epitaxial channel portion 11 over the substrate 10, and directly on the first semiconductor channel portion 601. The second semiconductor channel layer 602L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602L includes amorphous silicon or polysilicon. The second semiconductor channel layer 602L can be formed by a conformal deposition method such as low pressure chemical vapor deposition (LPCVD). The thickness of the second semiconductor channel layer 602L can be in a range from 2 nm to 10 nm, although lesser and greater thicknesses can also be employed. The second semiconductor channel layer 602L may partially fill the cavity 49' in each memory opening, or may fully fill the cavity in each memory opening.

The materials of the first semiconductor channel portion 601 and the second semiconductor channel layer 602L are collectively referred to as a semiconductor channel material. In other words, the semiconductor channel material is a set of all semiconductor material in the first semiconductor channel portion 601 and the second semiconductor channel layer 602L.

Figure 2F:
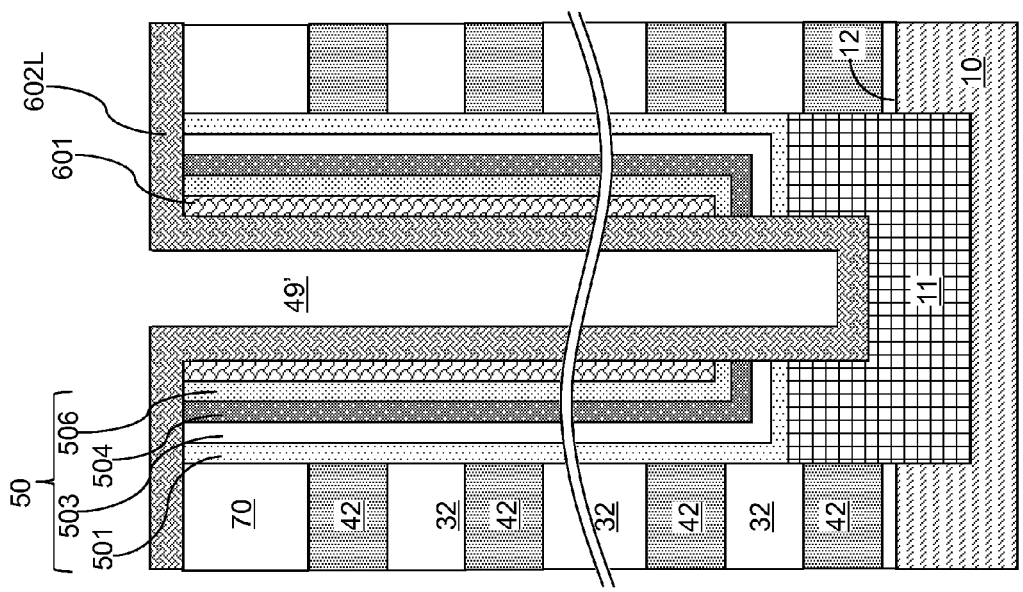

Referring to FIG. 2F, in case the cavity 49' in each memory opening is not completely filled by the second semiconductor channel layer 602L, a dielectric core layer 62L can be deposited in the cavity 49' to fill any remaining portion of the cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 2G, the horizontal portion of the dielectric core layer 62L can be removed, for example, by a recess etch from above the top surface of the insulating cap layer 70. Further, the horizontal portion of the second semiconductor channel layer 602L located above the top surface of the insulating cap layer 70 can be removed by a planarization process, which can employ a recess etch or chemical mechanical planarization (CMP). Each remaining portion of the second semiconductor channel layer 602L within a memory opening constitutes a second semiconductor channel portion 602.

Each adjoining pair of a first semiconductor channel portion 601 and a second semiconductor channel portion 602 can collectively form a semiconductor channel 60 through which electrical current can flow when a vertical NAND device including the semiconductor channel 60 is turned on. A tunneling dielectric 506 is embedded within a charge storage element 504, and laterally surrounds a portion of the semiconductor channel 60. Each adjoining set of a first blocking dielectric 501, a second blocking dielectric 503, a charge storage element 504, and a tunneling dielectric 506 collectively constitute a memory film 50, which can store electrical charges with a macroscopic retention time. In some embodiments, a first blocking dielectric 501 and/or a second blocking dielectric 503 may not be present in the memory film 50 at this step, and a blocking dielectric may be subsequently formed after formation of backside recesses. As used herein, a macroscopic retention time refers to a retention time suitable for operation of a memory device as a permanent memory device such as a retention time in excess of 24 hours.

The top surface of the remaining portion of the dielectric core layer 62L can be further recessed within each memory opening, for example, by a recess etch to a depth that is located between the top surface of the insulating cap layer 70 and the bottom surface of the insulating cap layer 70. Each remaining portion of the dielectric core layer 62L constitutes a dielectric core 62.

Referring to FIG. 2H, drain regions 63 can be formed by depositing a doped semiconductor material within each recessed region above the dielectric cores 62. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the drain regions 63. The combination of the memory film 50, drain region 63, semiconductor channel 60 and optionally the dielectric core 62 forms a memory stack structure 55.

Figure 3:
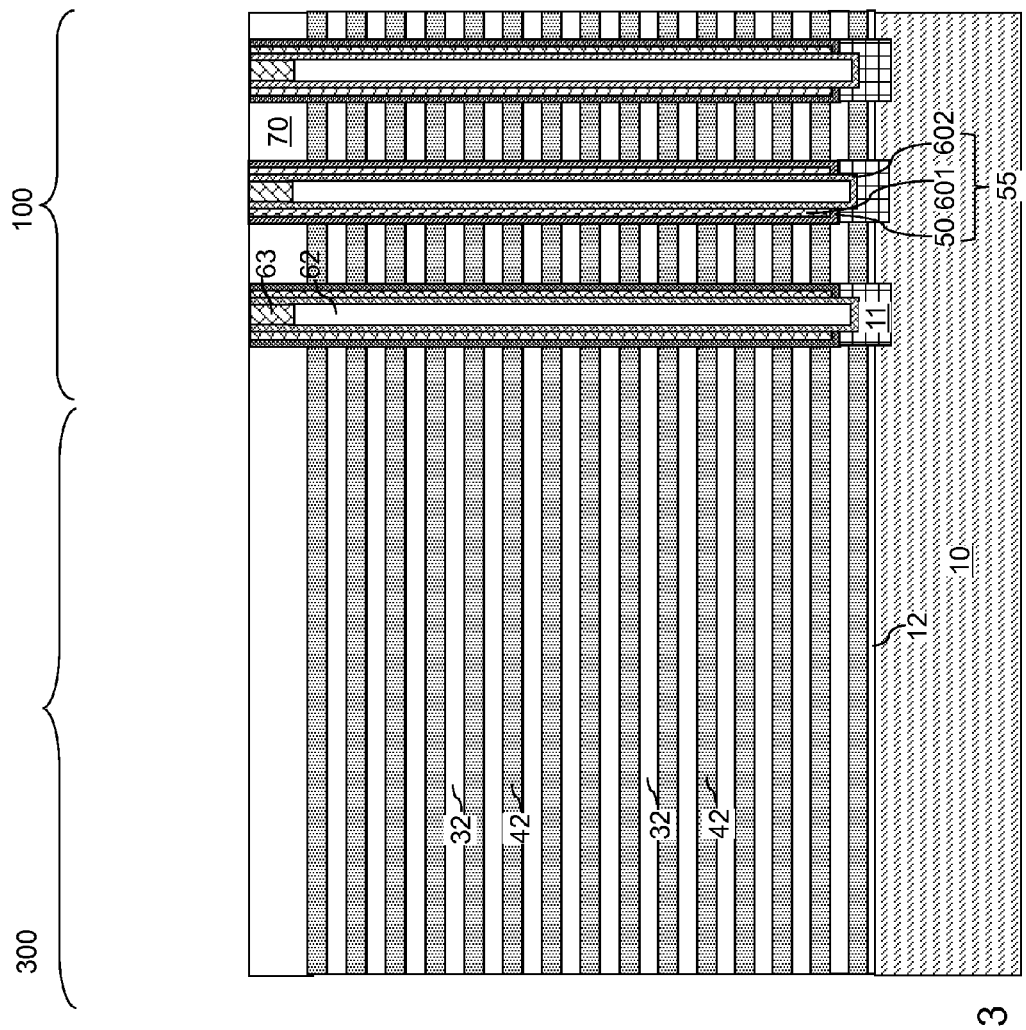
FIG. 3 is a vertical cross-sectional view of the exemplary structure after formation of memory stack structures according to an embodiment of the present disclosure.

The exemplary memory stack structure can be embedded into the exemplary structure illustrated in FIGS. 1A and 1B. FIG. 3 illustrates the exemplary structure that incorporates multiple instances of the exemplary memory stack structure of FIG. 2H. The exemplary structure includes a semiconductor device, which comprises a stack (32, 42) including an alternating plurality of material layers (e.g., the sacrificial material layers 42) and insulating layers 32 located over a semiconductor substrate 10, and a memory opening extending through the stack (32, 42). The semiconductor device further comprises a memory stack structure 55 vertically extending from a bottommost layer (e.g., the bottommost sacrificial material layer 42) of the stack to a topmost layer (e.g., the topmost sacrificial material layer 42) of the stack, and contacting a sidewall of the memory opening and a horizontal surface of the semiconductor substrate.

Figure 4:
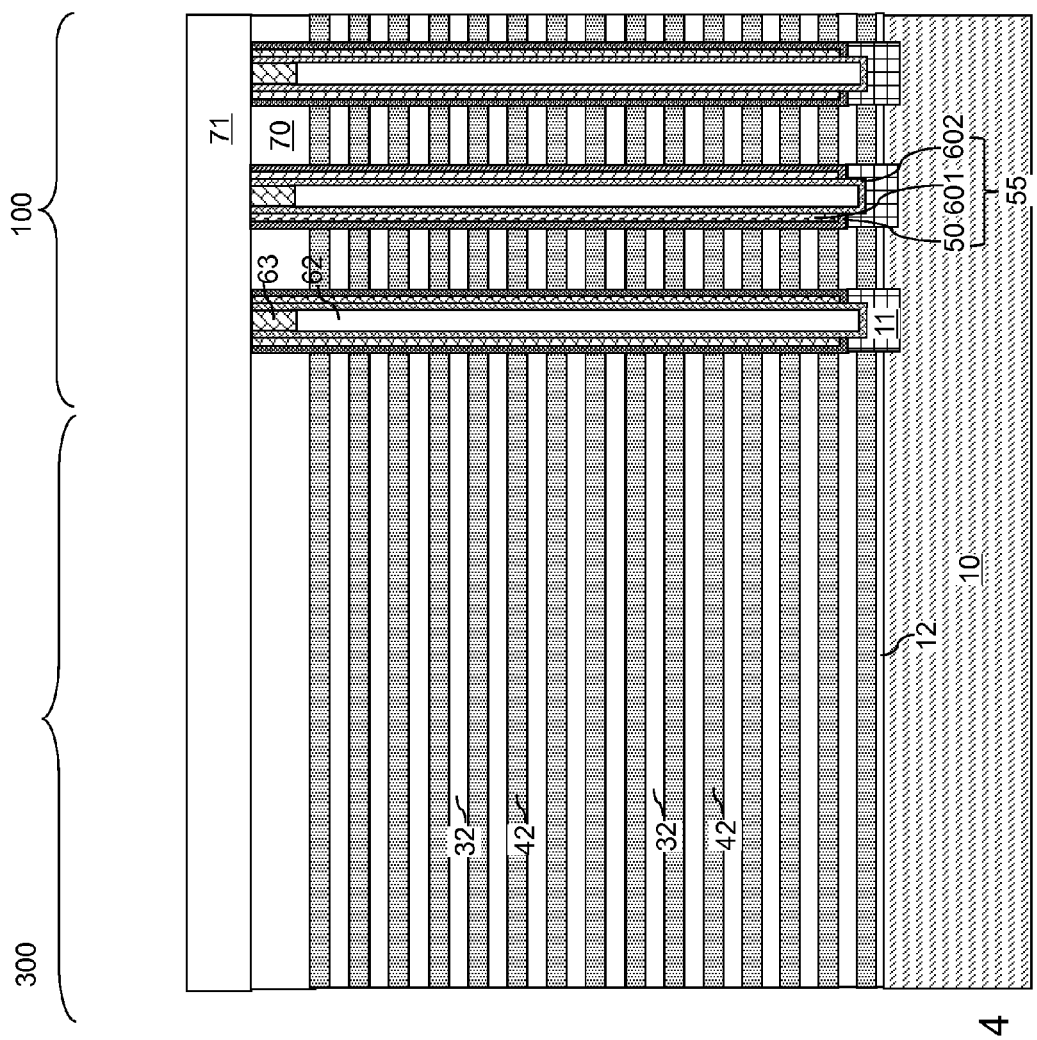
FIG. 4 is a vertical cross-sectional view of the exemplary structure after formation of an optional first contact level dielectric layer according to an embodiment of the present disclosure.

Referring to FIG. 4, an optional first contact level dielectric layer 71 can be formed over the substrate 10. As an optional structure, the first contact level dielectric layer 71 may, or may not, be formed. In case the first contact level dielectric layer 71 is formed, the first contact level dielectric layer 71 includes a dielectric material such as silicon oxide, silicon nitride, silicon oxynitride, porous or non-porous organosilicate glass (OSG), or a combination thereof. If an organosilicate glass is employed, the organosilicate glass may, or may not, be doped with nitrogen. The first contact level dielectric layer 71 can be formed over a horizontal plane including the top surface of the insulating cap layer 70 and the top surfaces of the drain regions 63. The first contact level dielectric layer 71 can be deposited by chemical vapor deposition, atomic layer deposition (ALD), spin-coating, or a combination thereof. The thickness of the first contact level dielectric layer 71 can be in a range from 10 nm to 300 nm, although lesser and greater thicknesses can also be employed.

In one embodiment, the first contact level dielectric layer 71 can be formed as a dielectric material layer having a uniform thickness throughout. The first contact level dielectric layer 71 may be formed as a single dielectric material layer, or can be formed as a stack of a plurality of dielectric material layers. Alternatively, formation of the first contact level dielectric layer 71 may be merged with formation of at least one line level dielectric layer (not shown). While the present disclosure is described employing an embodiment in which the first contact level dielectric layer 71 is a structure separate from an optional second contact level dielectric layer or at least one line level dielectric layer to be subsequently deposited, embodiments in which the first contact level dielectric layer 71 and at least one line level dielectric layer are formed at a same processing step, and/or as a same material layer, are expressly contemplated herein.

Optionally, a portion (not shown) of the alternating stack (32, 42) can be removed, for example, by applying and patterning a photoresist layer with an opening and by transferring the pattern of the opening through the alternating stack (32, 42) employing an etch such as an anisotropic etch. An optional trench extending through the entire thickness of the alternating stack (32, 42) can be formed within an area that includes a peripheral device region (not shown). Subsequently, the trench can be filled with an optional dielectric material such as silicon oxide. Excess portions of the dielectric material can be removed from above the top surface of the first contact level dielectric layer 71 by a planarization process such as chemical mechanical planarization and/or a recess etch. The top surfaces of the first contact level dielectric layer 71 can be employed as a stopping surface during the planarization. The remaining dielectric material in the trench constitutes a dielectric material portion (not shown).

Referring to FIGS. 5A-5E, a stepped cavity 69 can be formed within the contact region 300 by patterning a portion of the alternating stack (32, 42). The stepped cavity 69 can have various stepped surfaces such that the horizontal cross-sectional shape of the stepped cavity changes in steps as a function of the vertical distance from the top surface of the substrate 10. In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "stepped cavity" refers to a cavity having stepped surfaces. A "step" refers to a vertical shift in the height of a set of adjoined surfaces.

In one embodiment, multiple sets (R1, R2, R3, R4) of stepped surfaces can be formed by patterning the alternating stack (32, 42) such that at least one step includes sidewalls of multiple spacer material layers 42 that are vertically coincident. In one embodiment, each set (R1, R2, R3, or R4) of stepped surfaces can include sidewalls of multiple spacer material layers 42 and multiple insulator layers 32 that are vertically coincident. In one embodiment, the multiple sets (R1, R2, R3, R4) of stepped surfaces can include n (e.g., 4) sets of stepped surfaces in which n is an integer greater than 1. For example, the multiple sets (R1, R2, R3, R4) of stepped surfaces can include a first set R1 of stepped surfaces including a first set of vertically coincident sidewalls of a first subset of the spacer material layers 42 (for example, (nk+1)-th spacer material layers as counted from above the level of the topmost spacer material layer that is employed or to be employed as a source select gate layer, in which k is a non-negative integer) that are located at first set of levels; a second set R2 of stepped surfaces including a second set of vertically coincident sidewalls of a second subset of the spacer material layers 42 (for example, (nk+2)-th spacer material layers as counted from above the level of the topmost spacer material layer that is employed or to be employed as a source select gate layer, in which k is a non-negative integer) that are located at second set of levels; and, if n is greater than 2, an i-th set Ri of stepped surfaces including an i-th set of vertically coincident sidewalls of an i-th subset of the spacer material layers 42 (for example, (nk+i)-th spacer material layers as counted from above the level of the topmost spacer material layer that is employed or to be employed as a source select gate layer, in which k is a non-negative integer) that are located at i-th levels for each integer i greater than 2 and not greater than n.

Figure 5A:
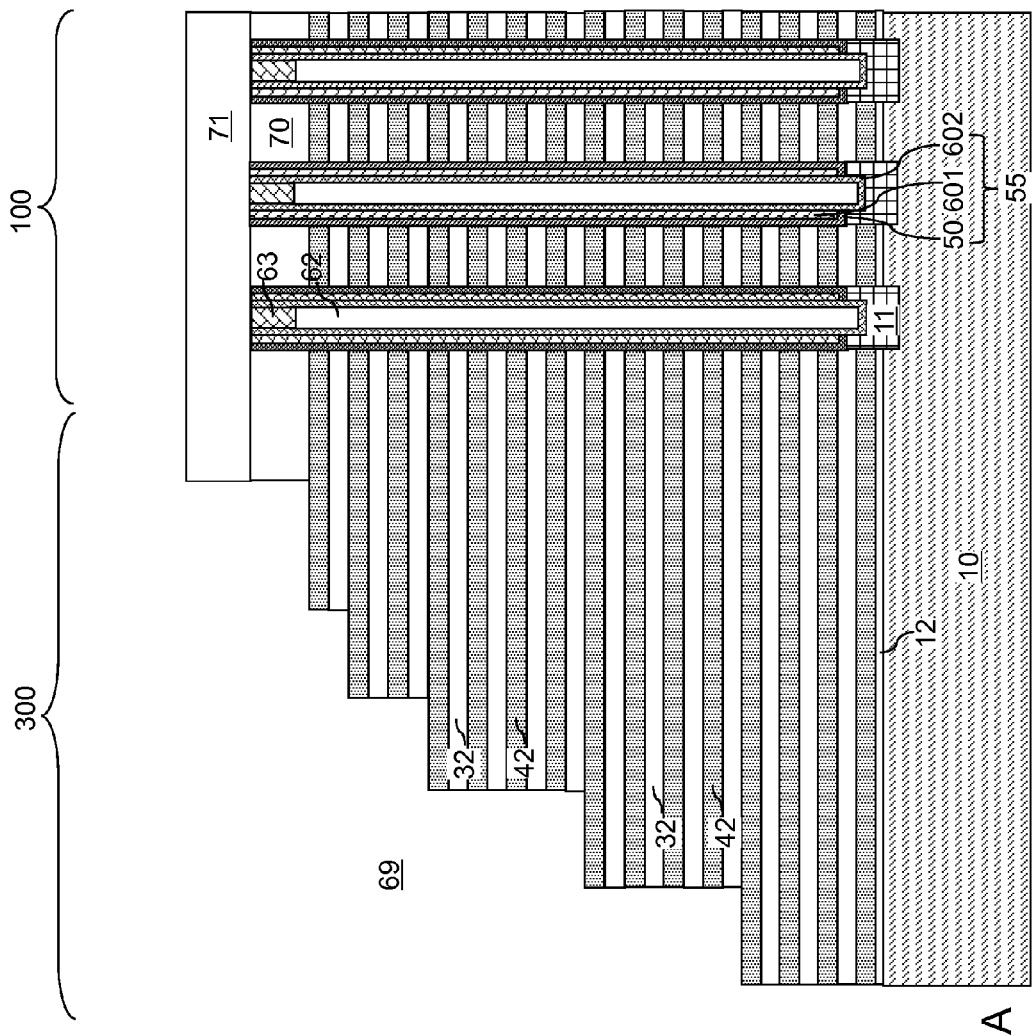
FIG. 5A is a vertical cross-sectional view of the exemplary structure after formation of a stepped terrace according to an embodiment of the present disclosure.
Figure 5B:
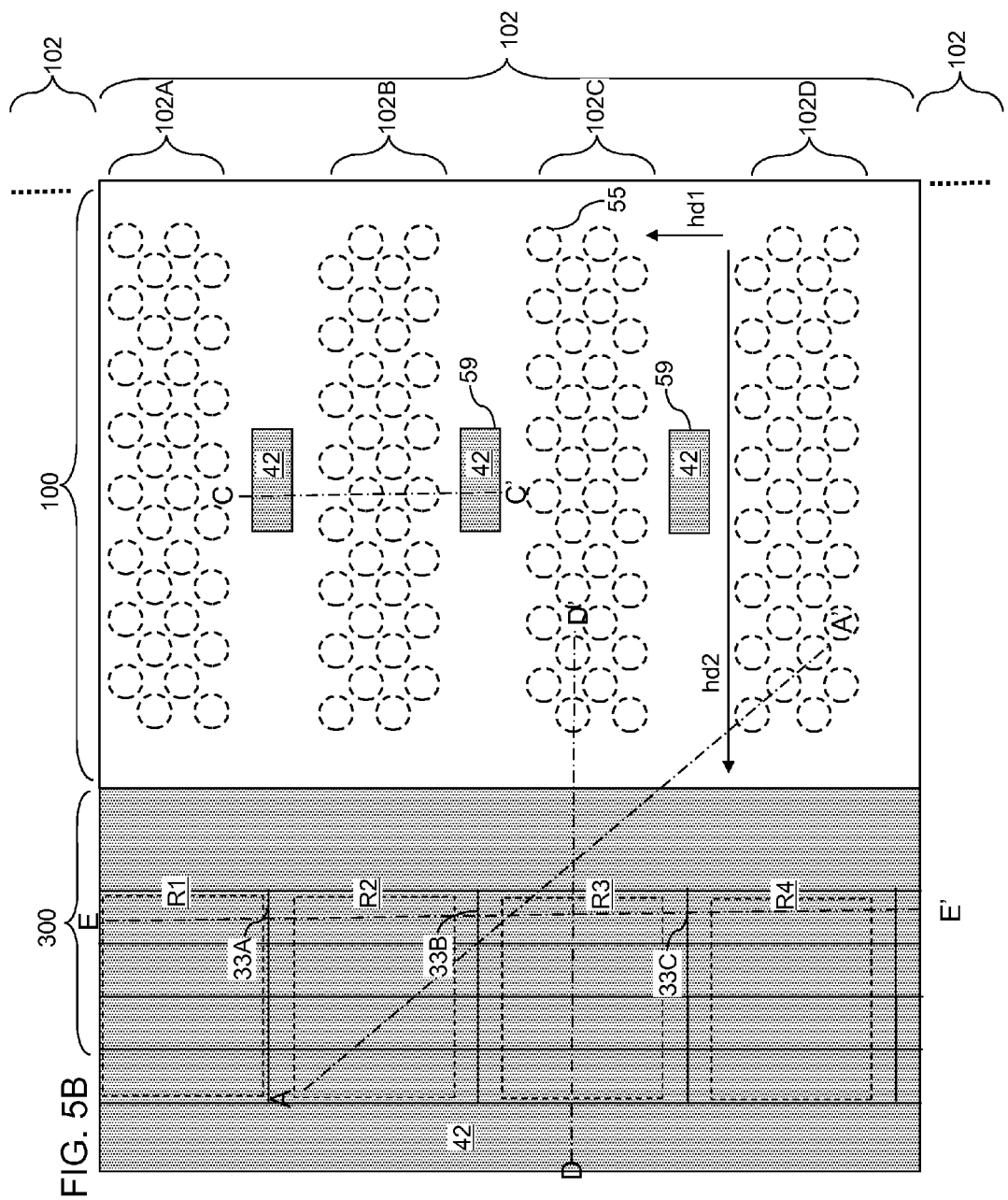
FIG. 5B is a top-down view of the exemplary structure of FIG. 5A with annotations for areas of memory stack structures according to an embodiment of the present disclosure. The vertical plane A-A' corresponds to the plane of the vertical cross-sectional view of FIG. 5A.
Figure 5C:
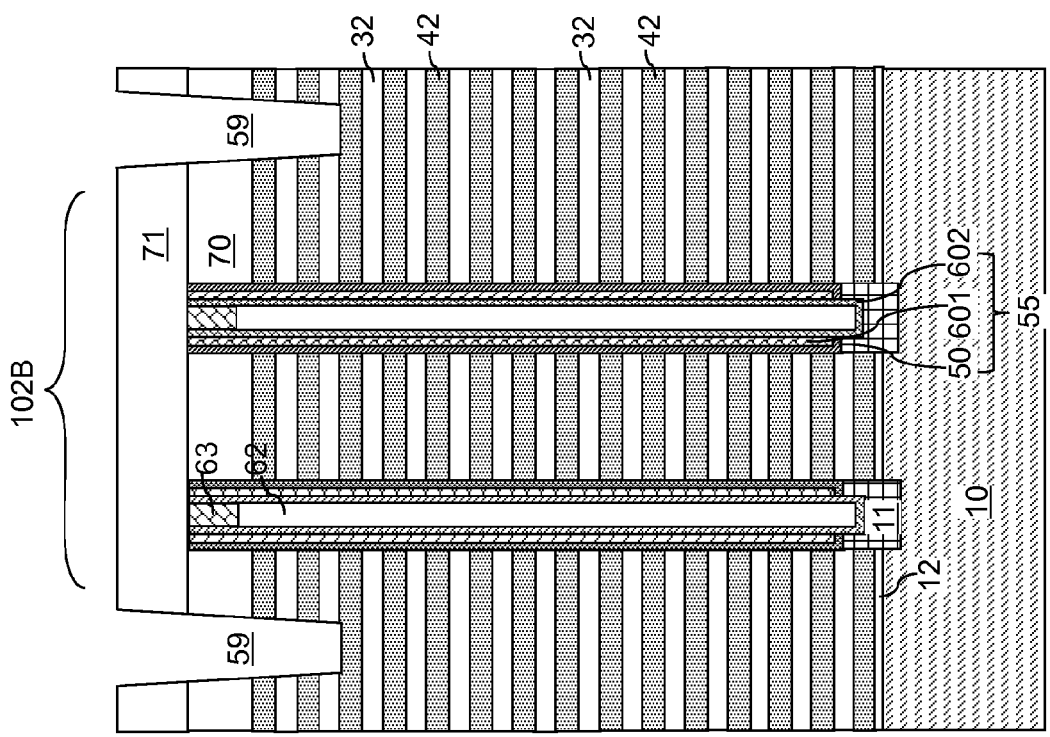
FIG. 5C is a vertical cross-sectional view of the exemplary structure of FIG. 5B along the vertical plane C-C'.
Figure 5D:
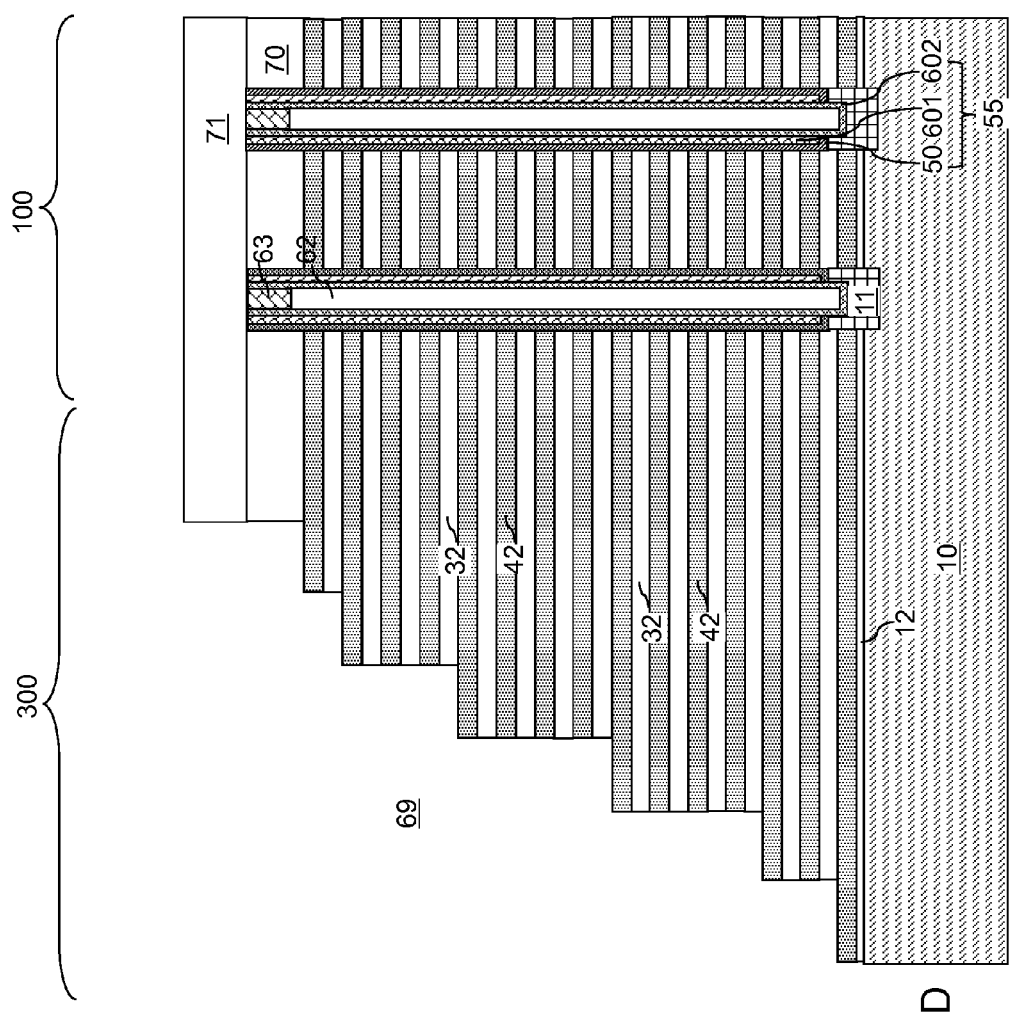
FIG. 5D is a vertical cross-sectional view of the exemplary structure of FIG. 5B along the vertical plane D-D'.
Figure 5E:
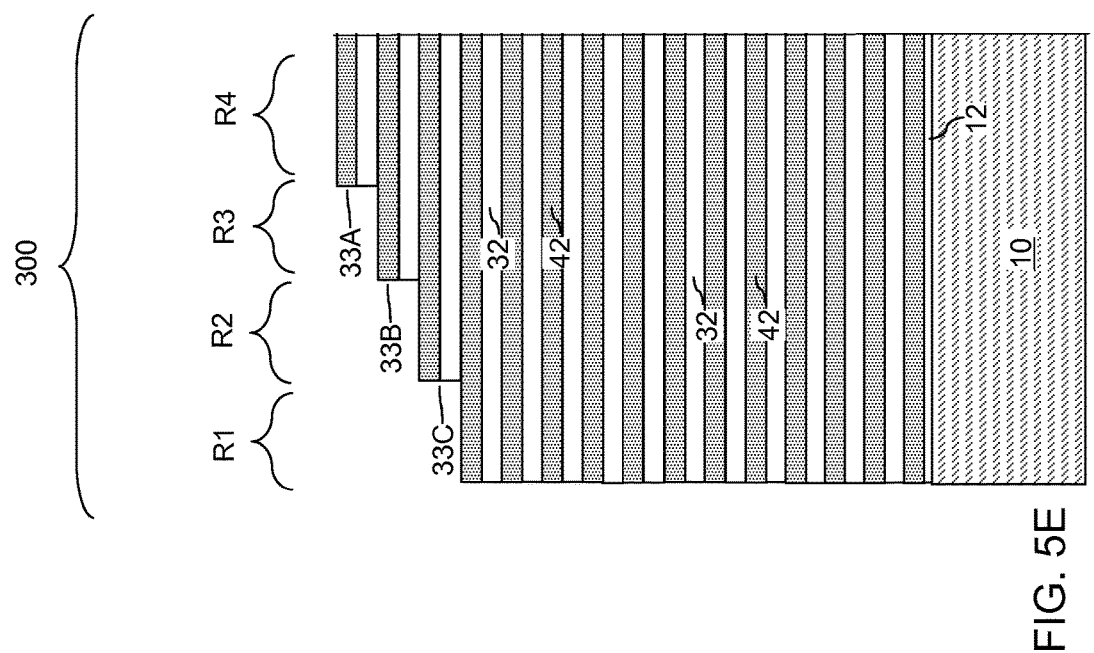
FIG. 5E is a vertical cross-sectional view of the exemplary structure of FIG. 5B along the vertical plane E-E'.
Figure 6A:
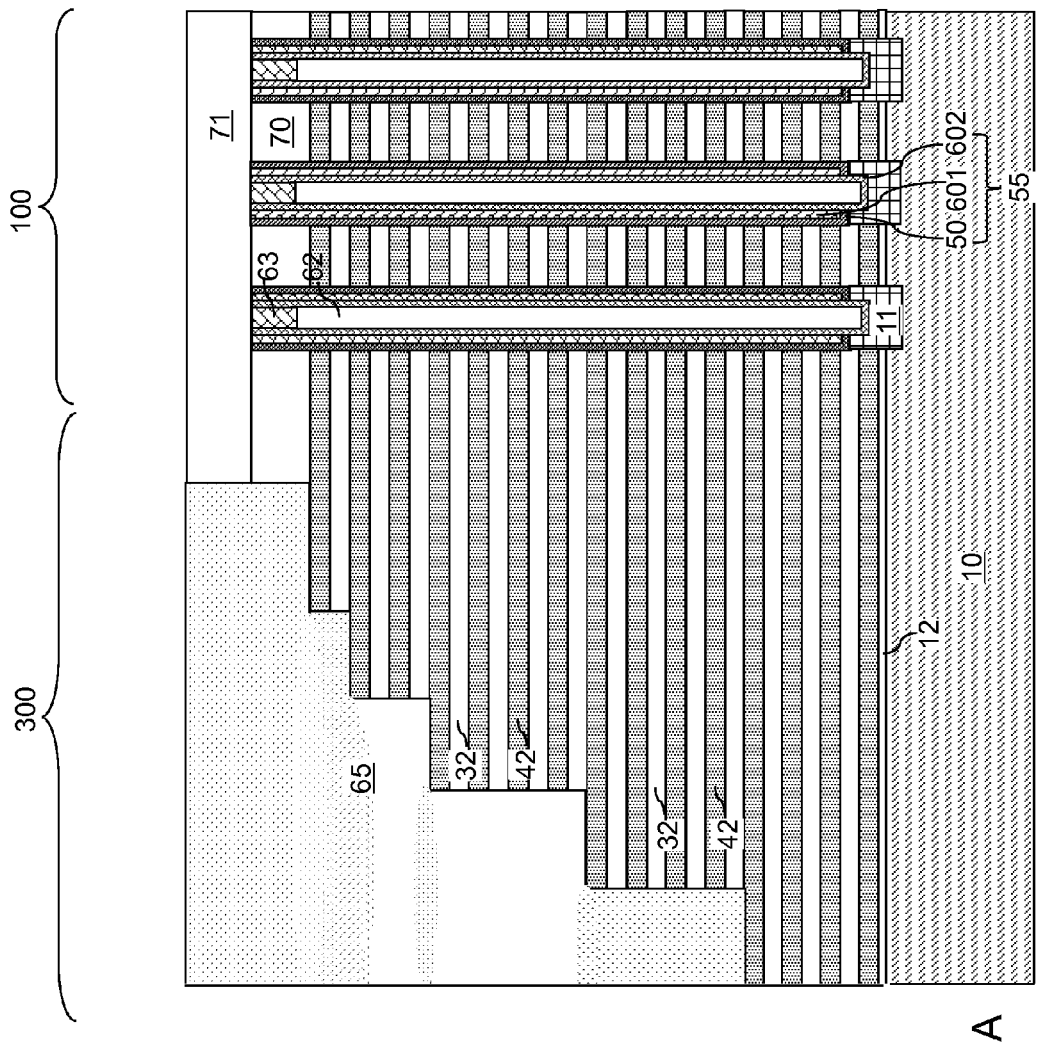
FIG. 6A is a vertical cross-sectional view of the exemplary structure after formation of a retro-stepped dielectric material portion according to an embodiment of the present disclosure.
Figure 6B:
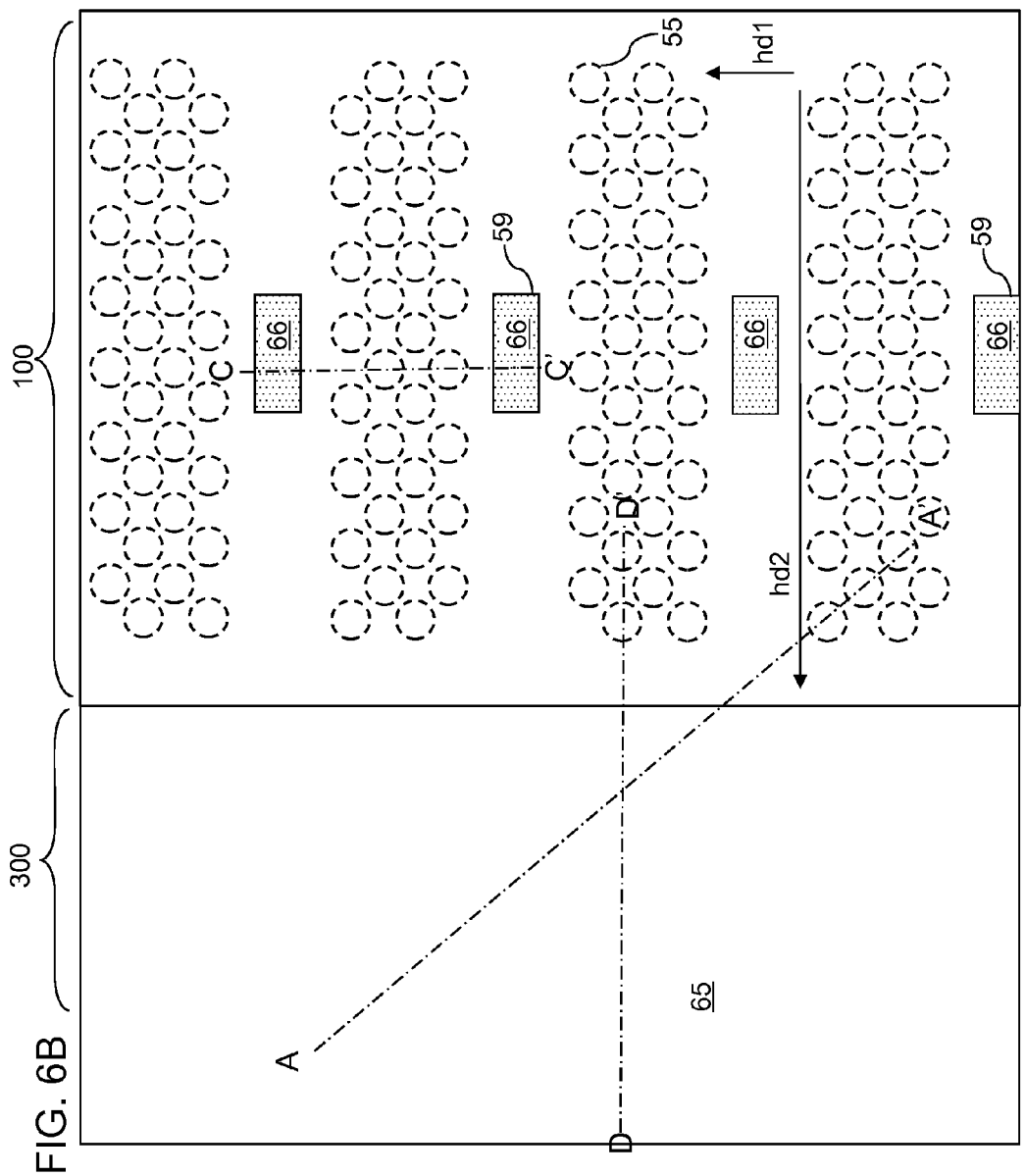
FIG. 6B is a top-down view of the exemplary structure of FIG. 6A with annotations for areas of memory stack structures according to an embodiment of the present disclosure. The vertical plane A-A' corresponds to the plane of the vertical cross-sectional view of FIG. 6A.
Figure 6C:
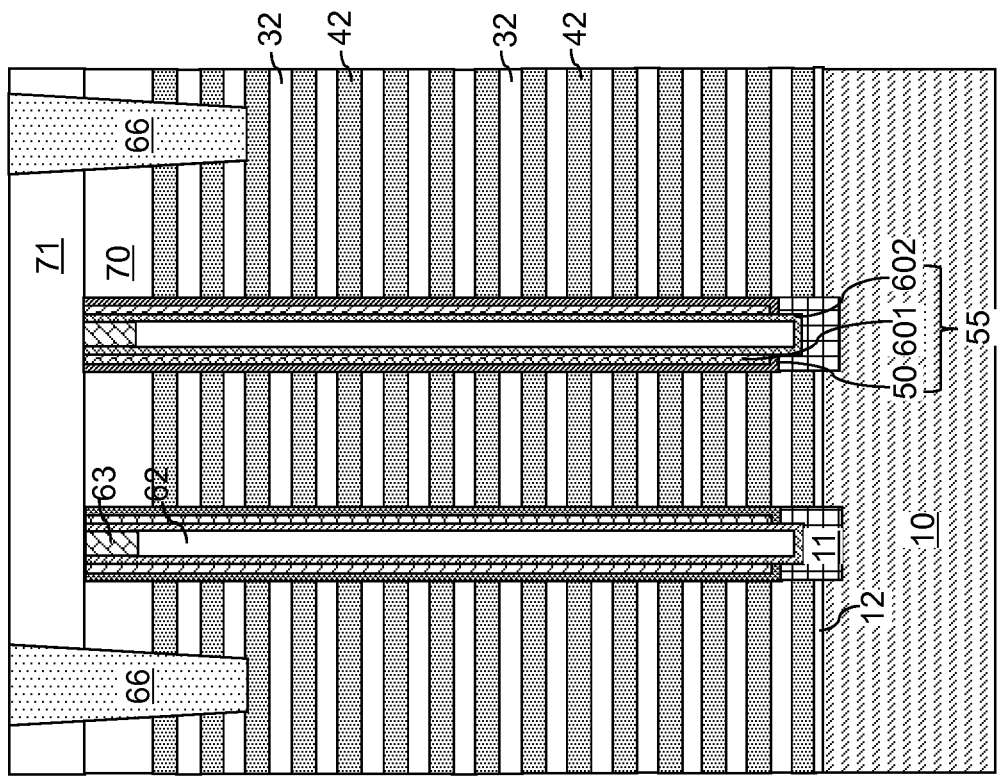
FIG. 6C is a vertical cross-sectional view of the exemplary structure of FIG. 6B along the vertical plane C-C'.
Figure 6D:
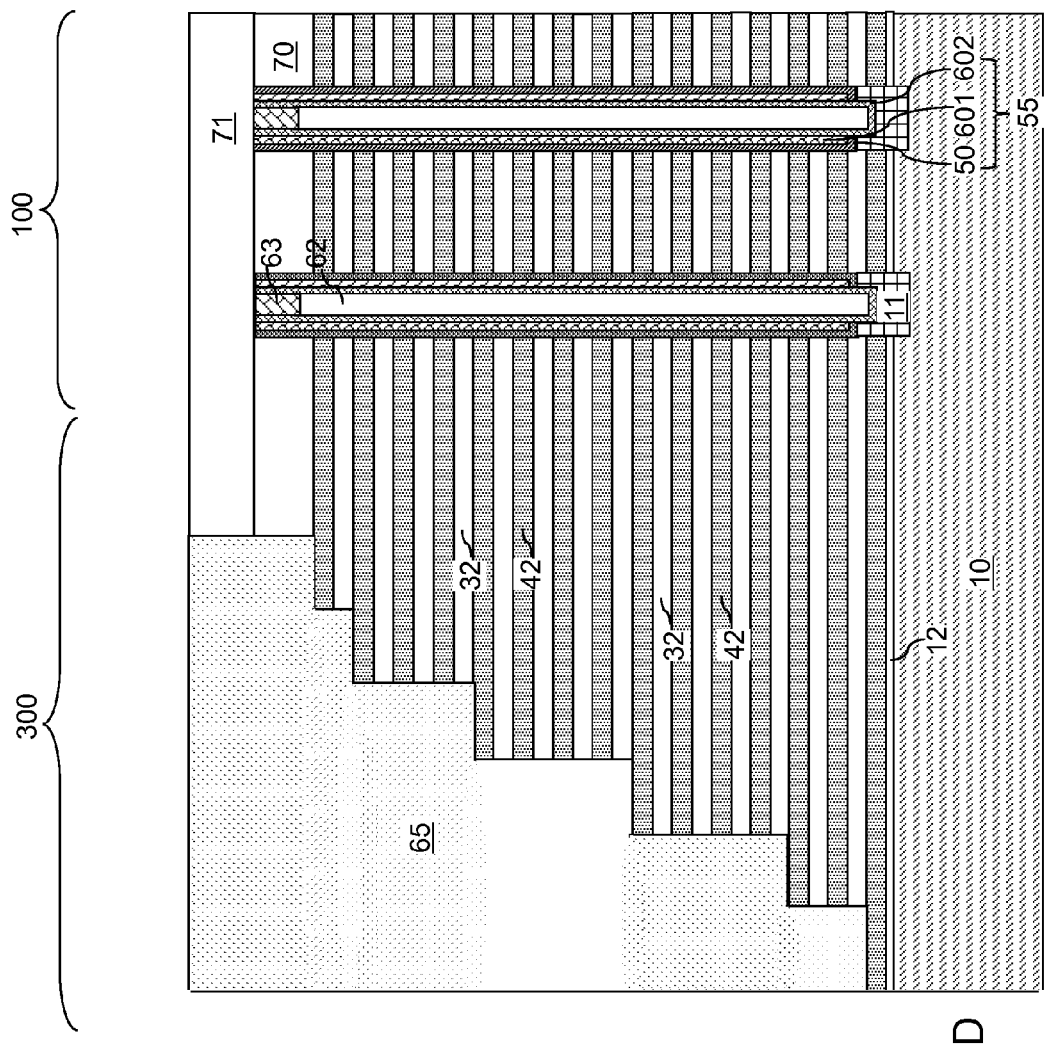
FIG. 6D is a vertical cross-sectional view of the exemplary structure of FIG. 6B along the vertical plane D-D'.
Figure 7A:
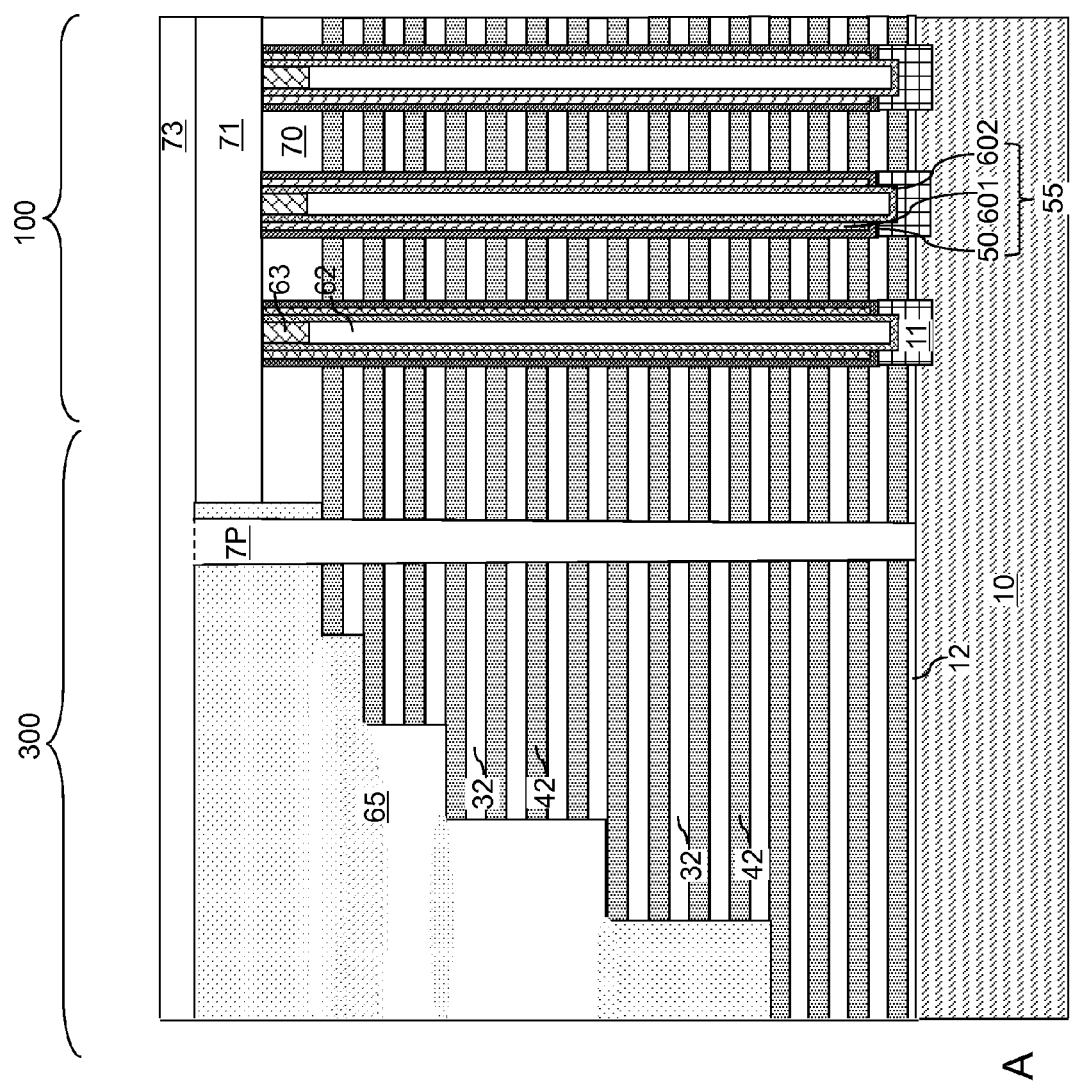
FIG. 7A is a vertical cross-sectional view of the exemplary structure after formation of a retro-stepped dielectric material portion according to an embodiment of the present disclosure.
Figure 7B:
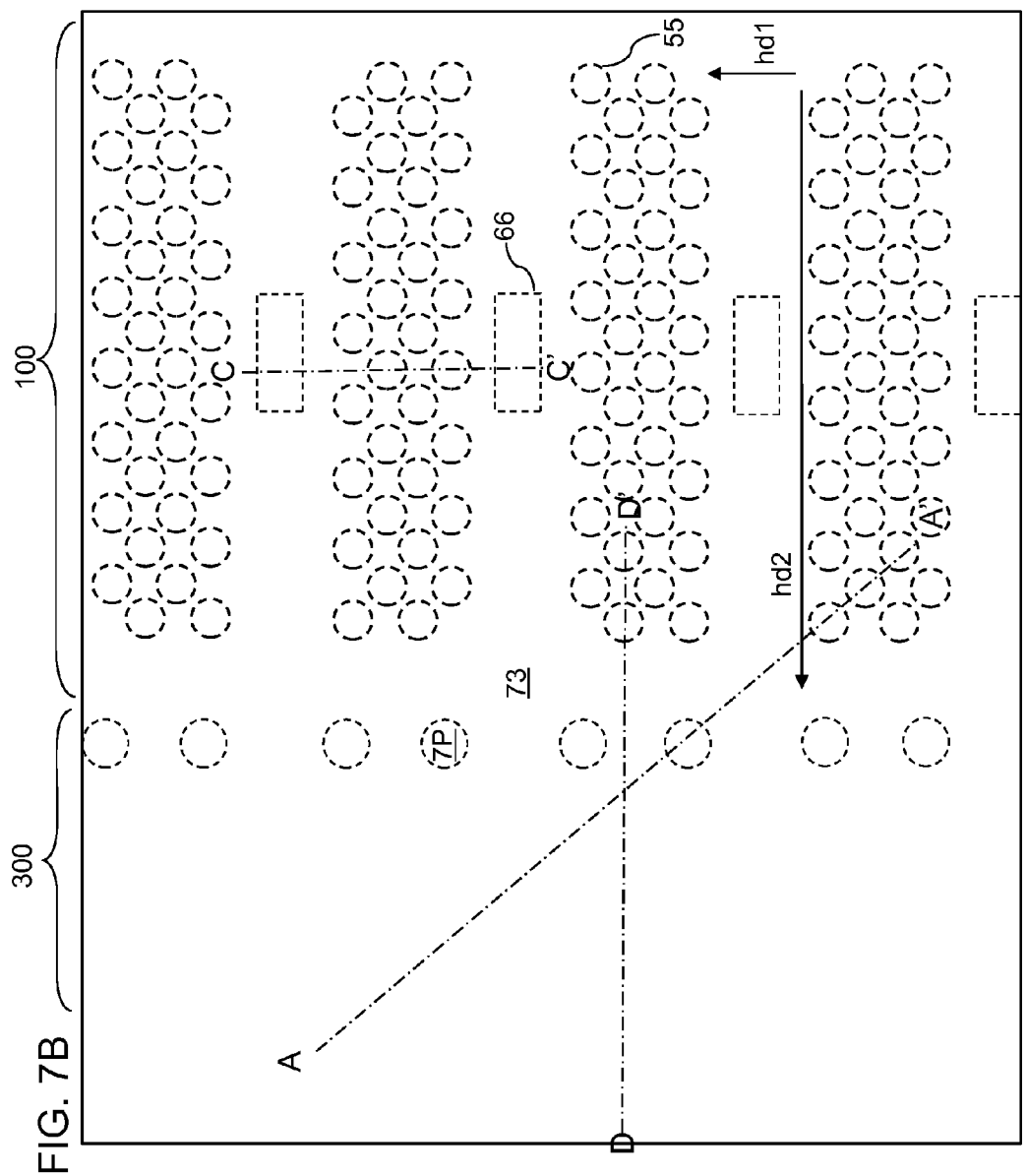
FIG. 7B is a top-down view of the exemplary structure of FIG. 7A with annotations for areas of memory stack structures according to an embodiment of the present disclosure. The vertical plane A-A' corresponds to the plane of the vertical cross-sectional view of FIG. 7A.
Figure 7C:
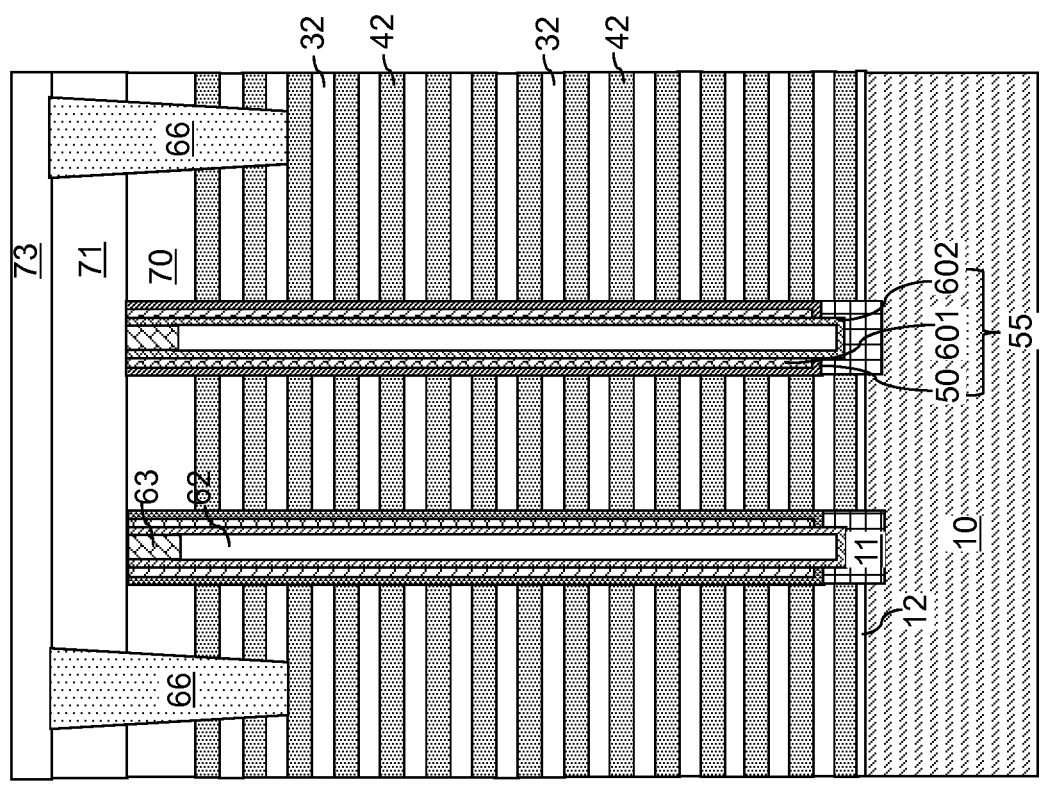
FIG. 7C is a vertical cross-sectional view of the exemplary structure of FIG. 7B along the vertical plane C-C'.
Figure 7D:
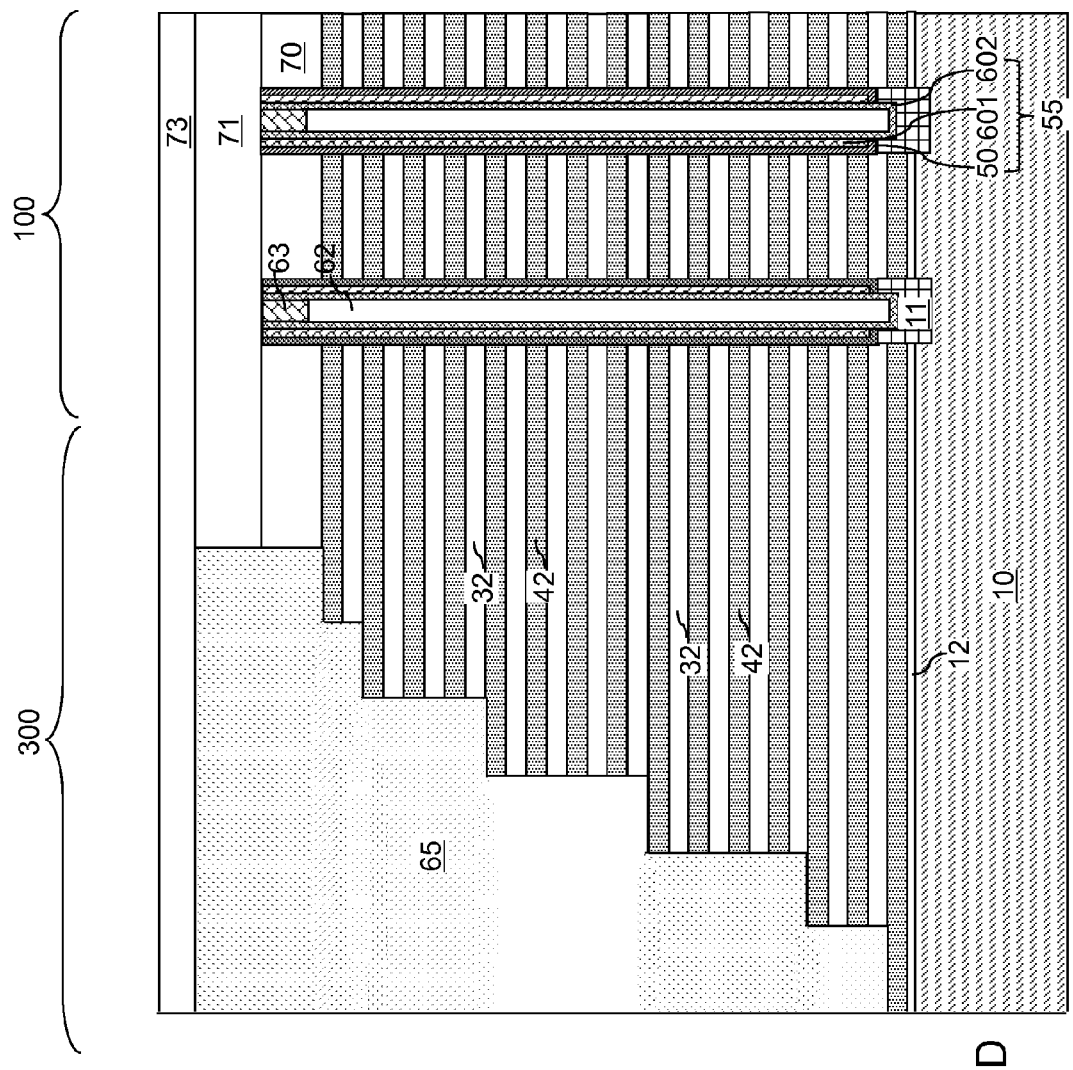
FIG. 7D is a vertical cross-sectional view of the exemplary structure of FIG. 7B along the vertical plane D-D'.
Figure 8A:
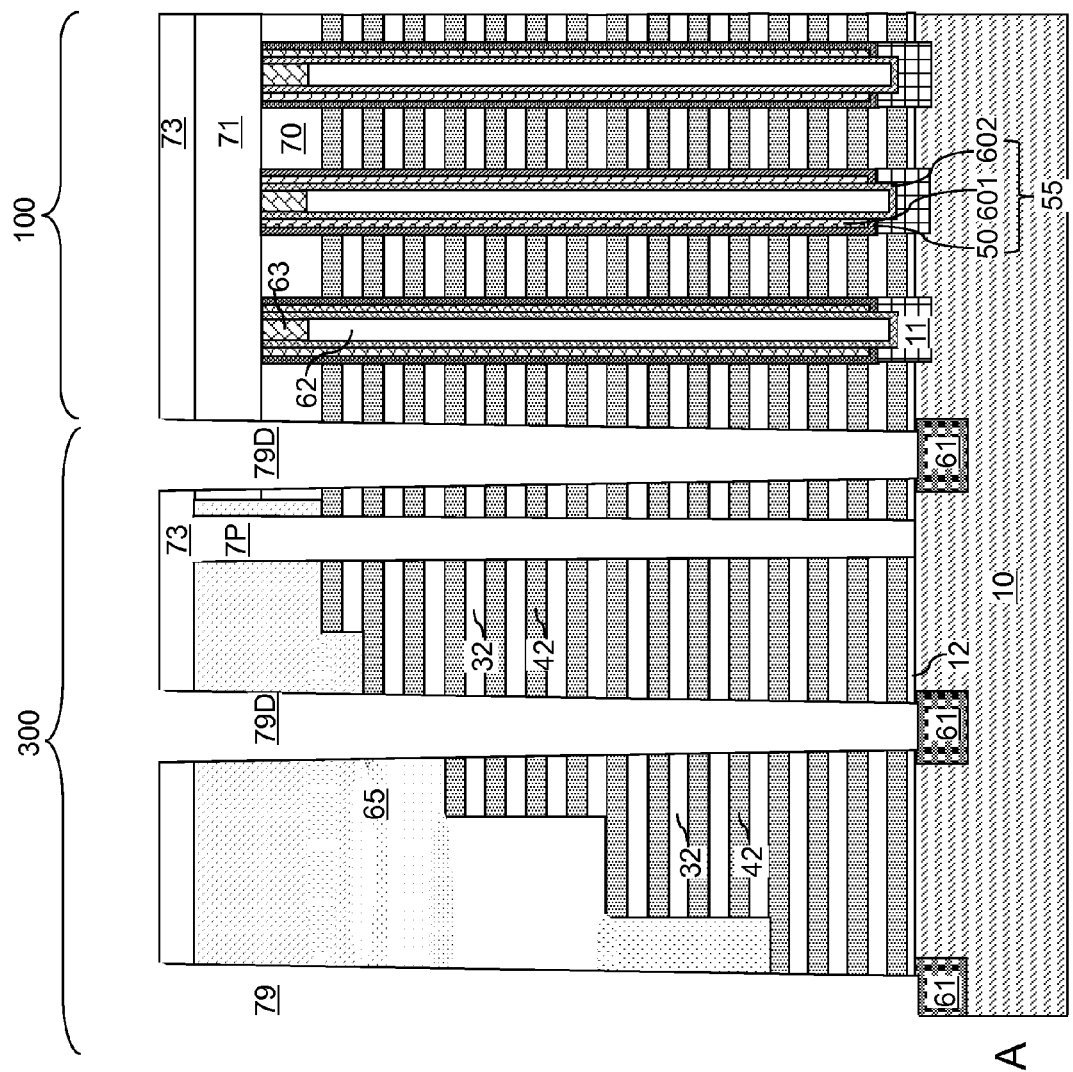
FIG. 8A is a vertical cross-sectional view of the exemplary structure after formation of backside contact trenches according to an embodiment of the present disclosure.
Figure 8B:
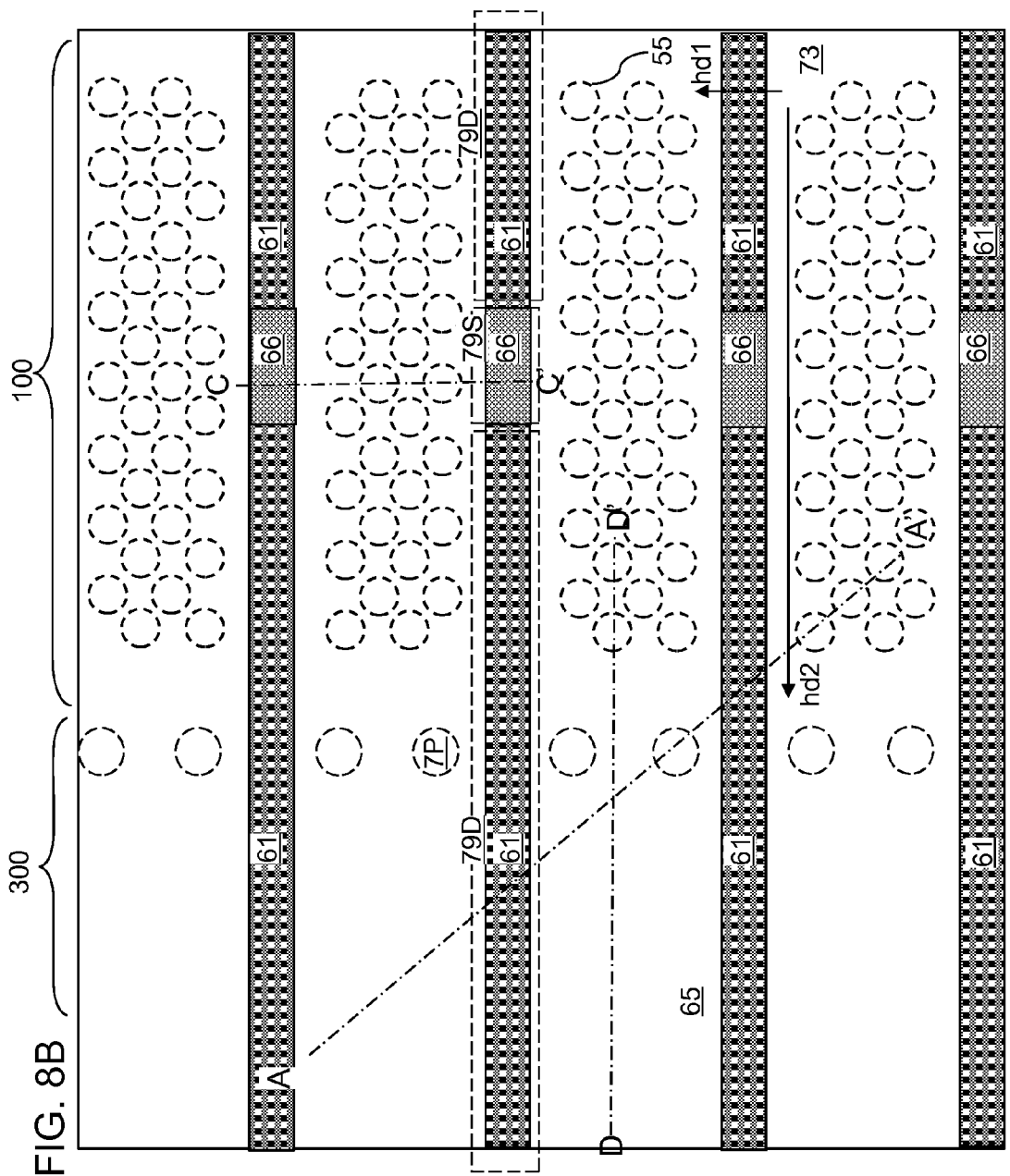
FIG. 8B is a top-down view of the exemplary structure of FIG. 8A with annotations for areas of memory stack structures according to an embodiment of the present disclosure. The vertical plane A-A' corresponds to the plane of the vertical cross-sectional view of FIG. 8A.
Figure 8C:
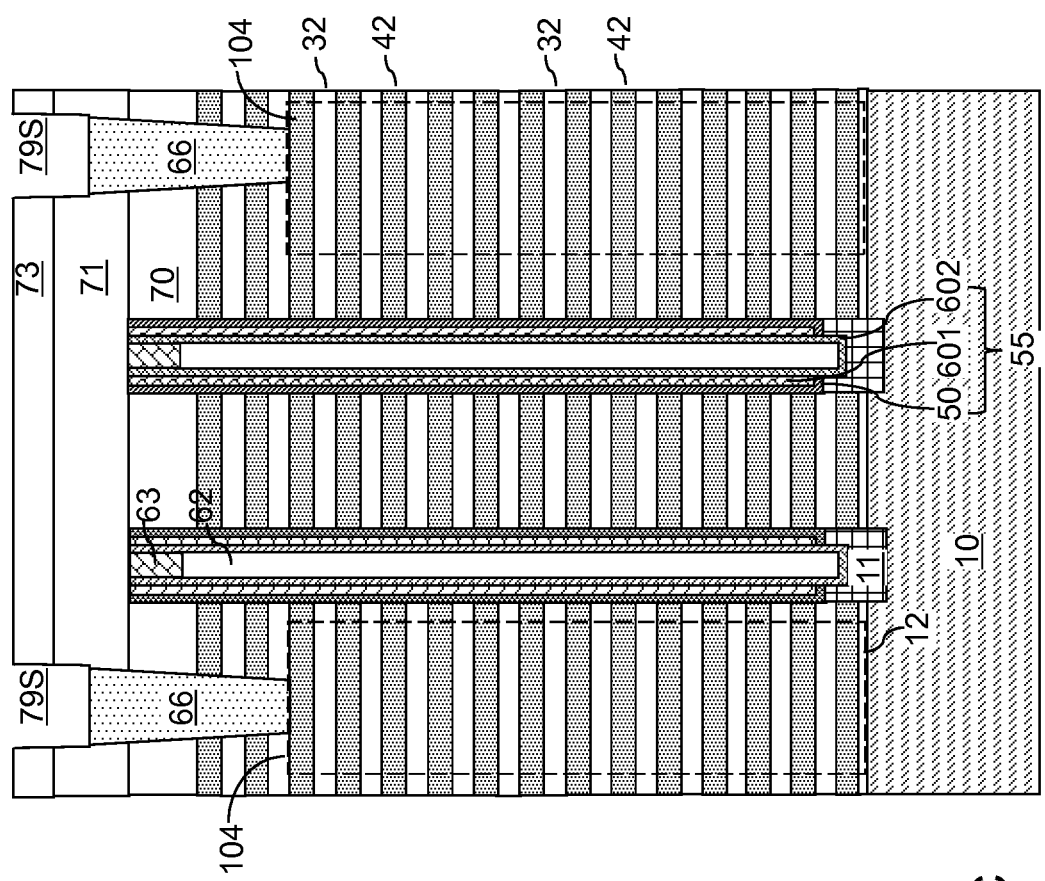
FIG. 8C is a vertical cross-sectional view of the exemplary structure of FIG. 8B along the vertical plane C-C'.
Figure 8D:
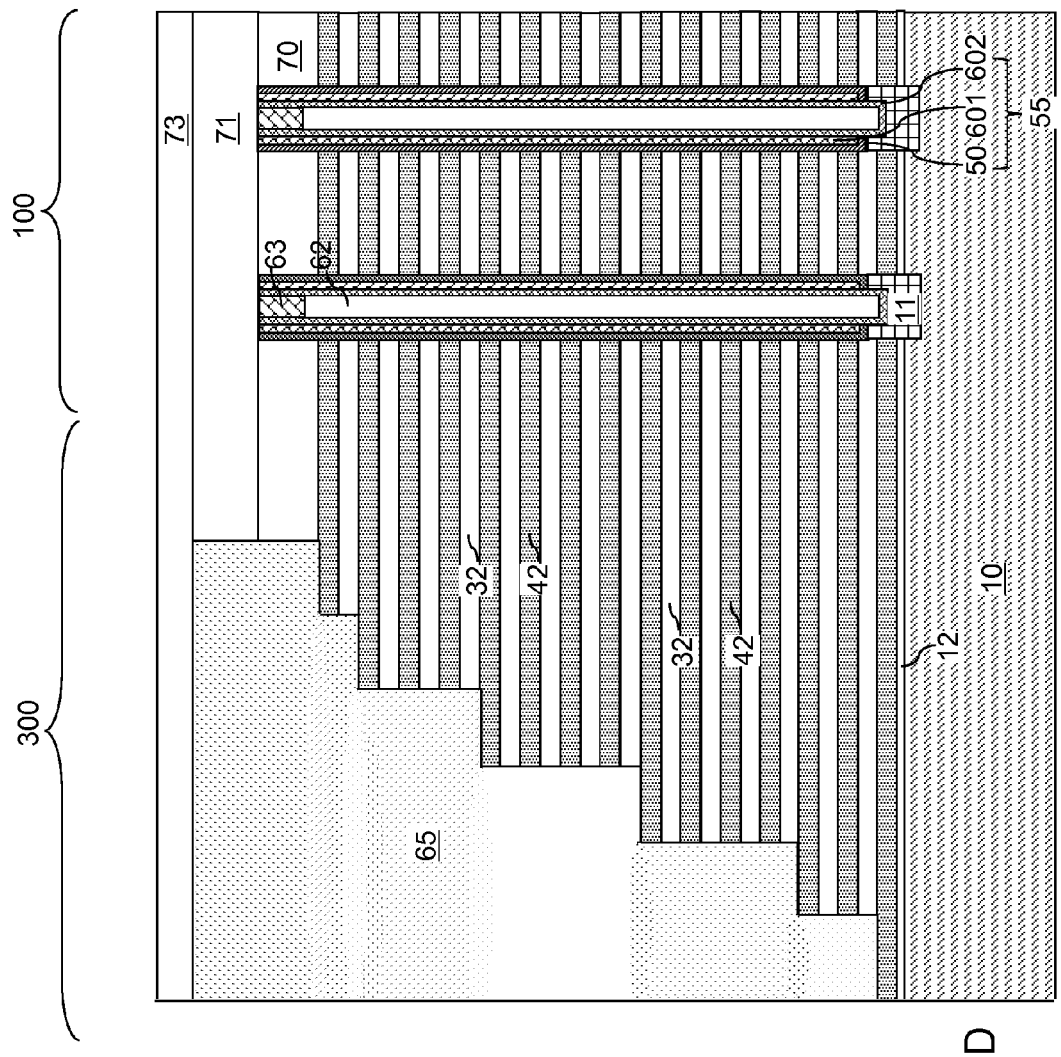
FIG. 8D is a vertical cross-sectional view of the exemplary structure of FIG. 8B along the vertical plane D-D'.
Figure 9A:
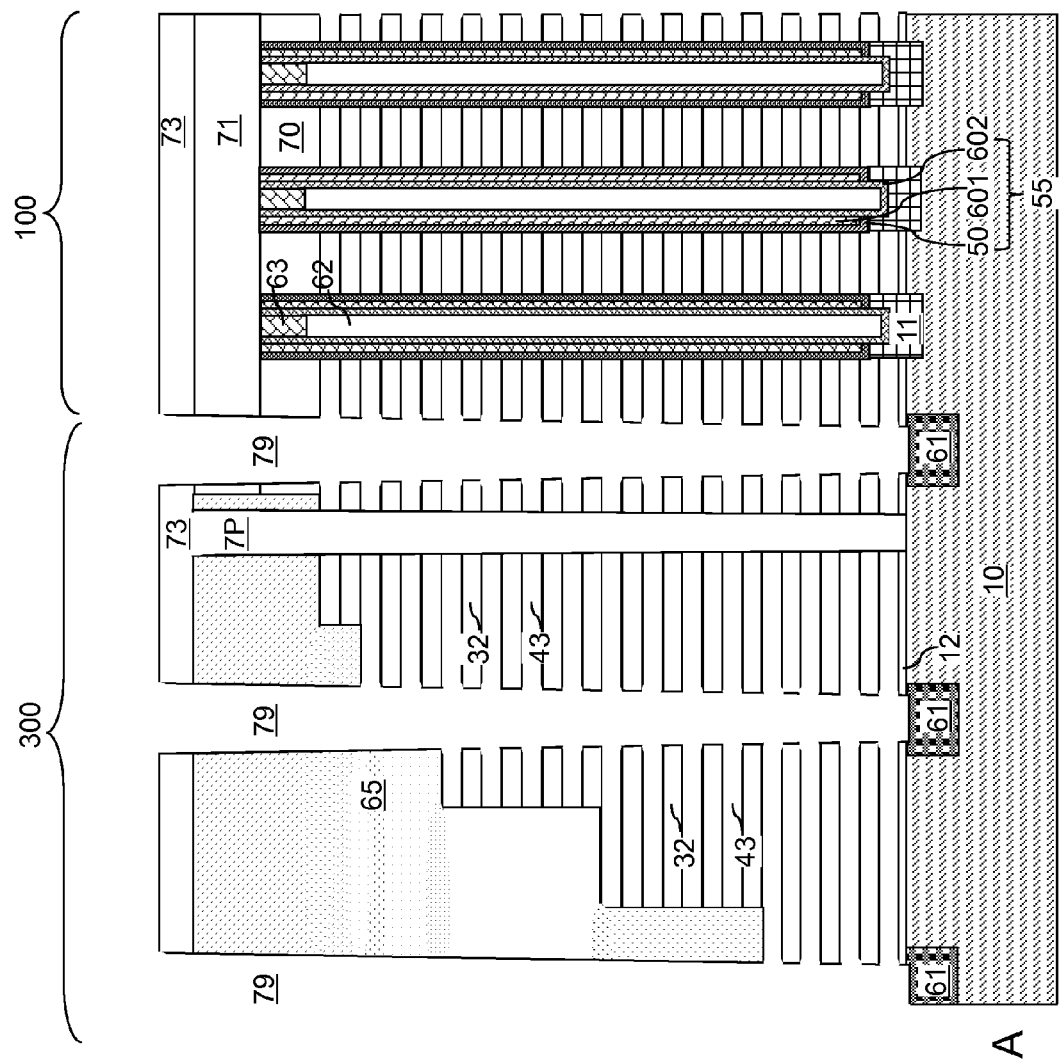
FIG. 9A is a vertical cross-sectional view of the exemplary structure after formation of backside recesses according to an embodiment of the present disclosure.
Figure 9B:
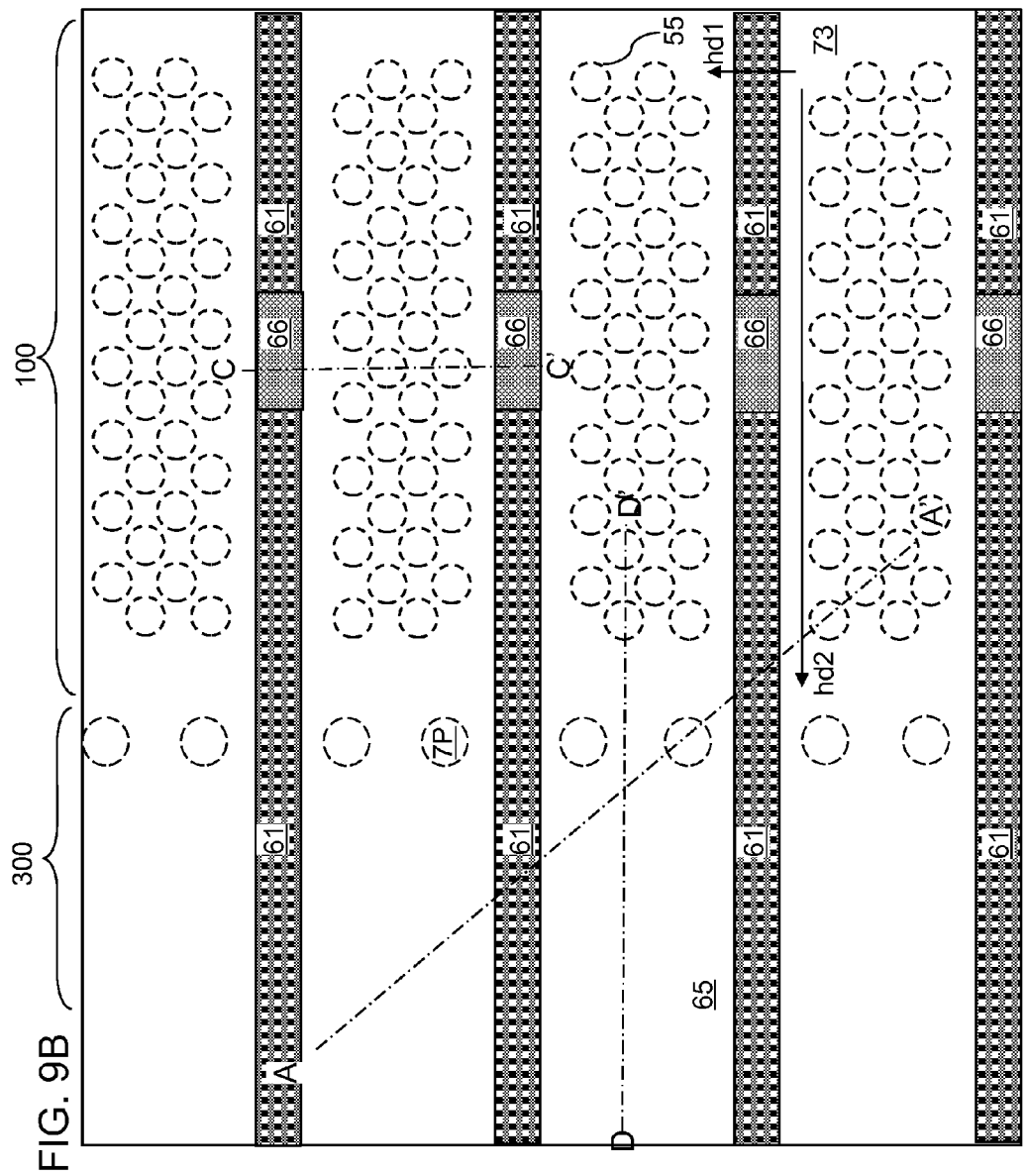
FIG. 9B is a top-down view of the exemplary structure of FIG. 9A with annotations for areas of memory stack structures according to an embodiment of the present disclosure. The vertical plane A-A' corresponds to the plane of the vertical cross-sectional view of FIG. 9A.
Figure 9C:
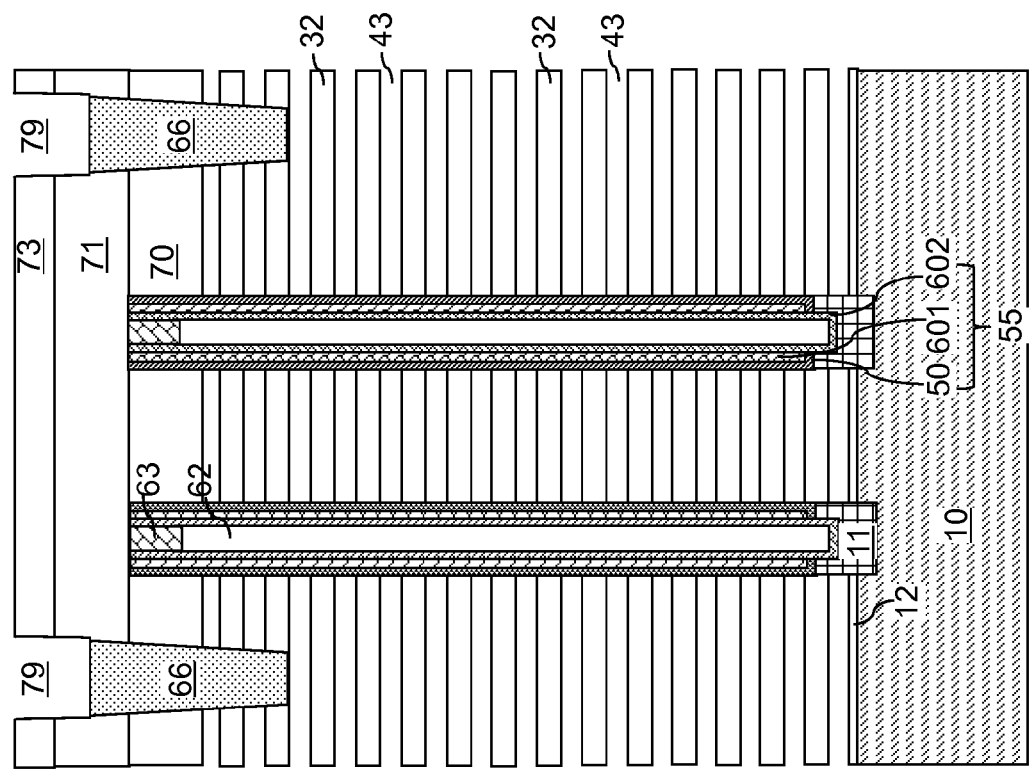
FIG. 9C is a vertical cross-sectional view of the exemplary structure of FIG. 9B along the vertical plane C-C'.
Figure 9D:
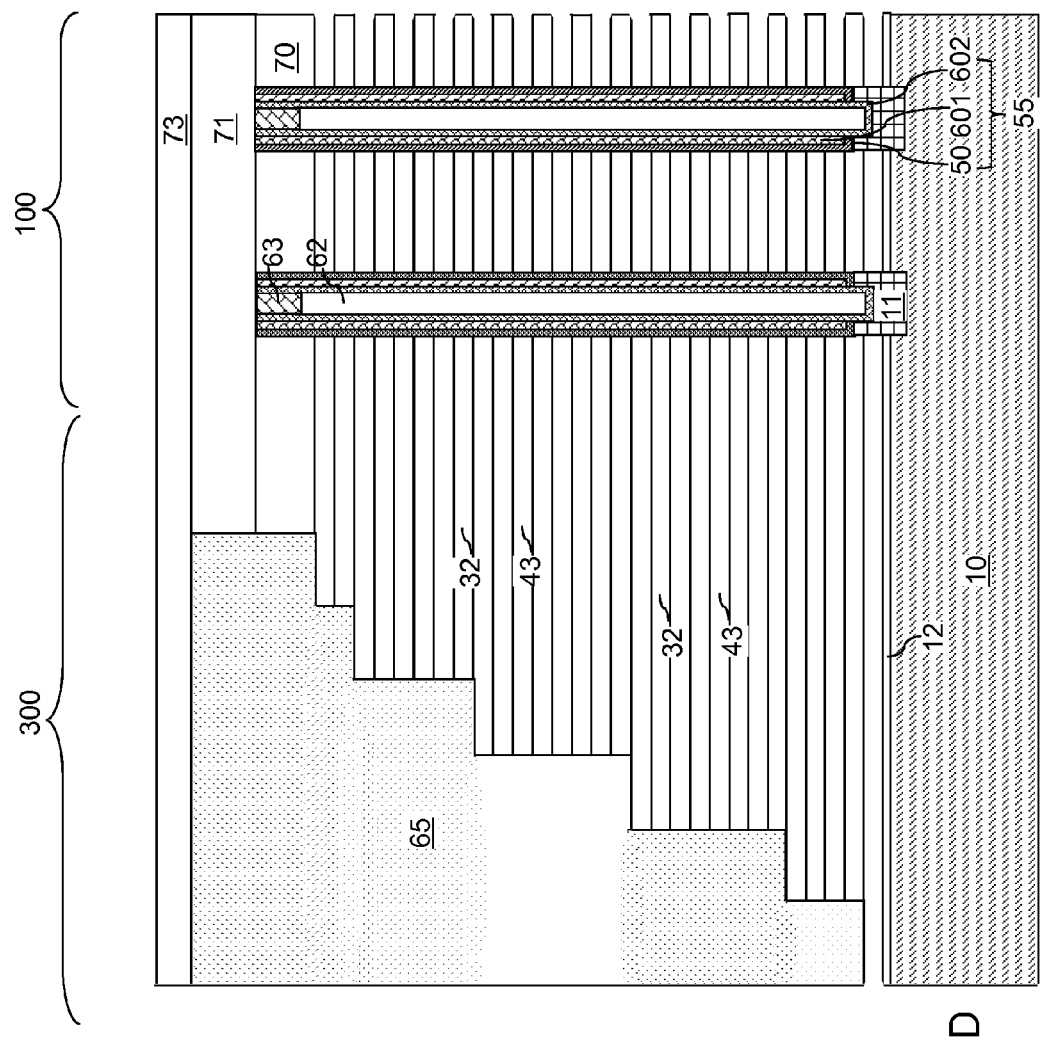
FIG. 9D is a vertical cross-sectional view of the exemplary structure of FIG. 9B along the vertical plane D-D'.
Figure 10A:
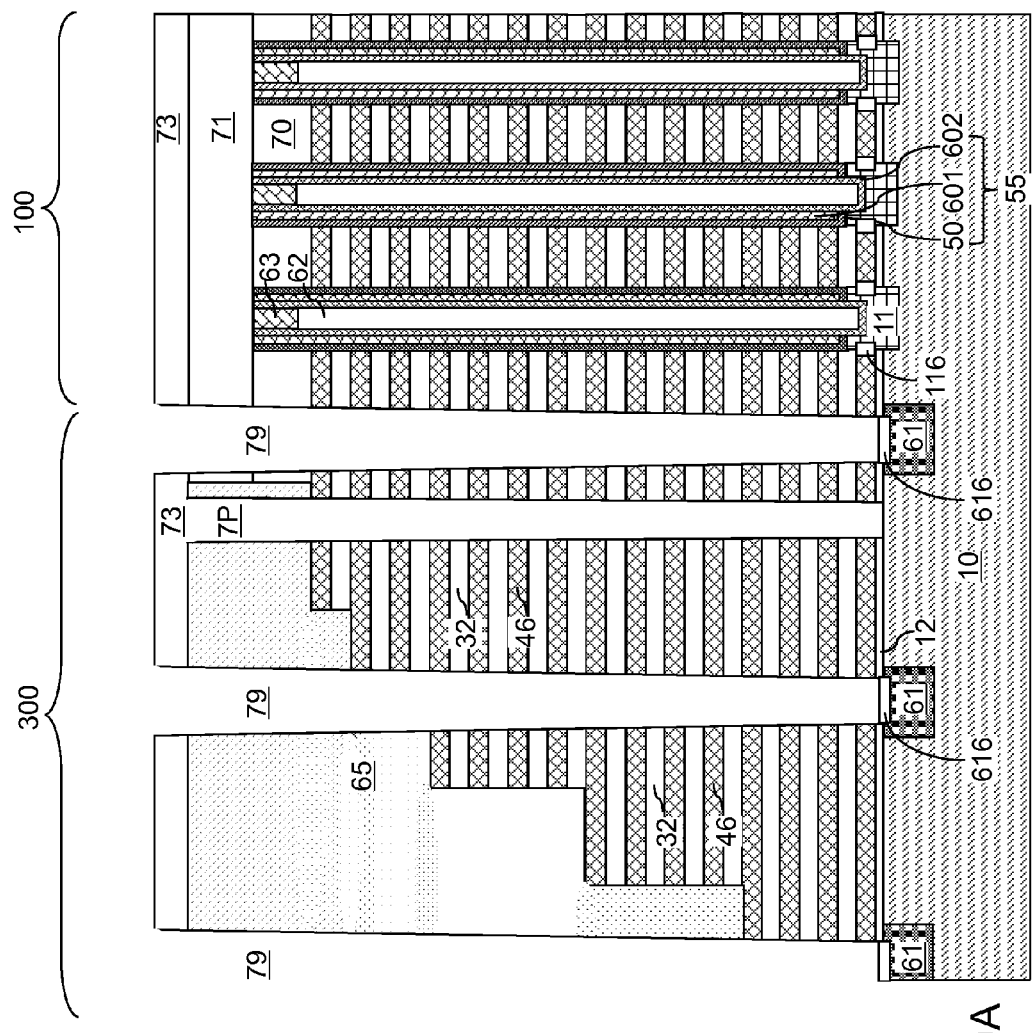
FIG. 10A is a vertical cross-sectional view of the exemplary structure after formation of electrically conductive layers according to an embodiment of the present disclosure.
Figure 10B:
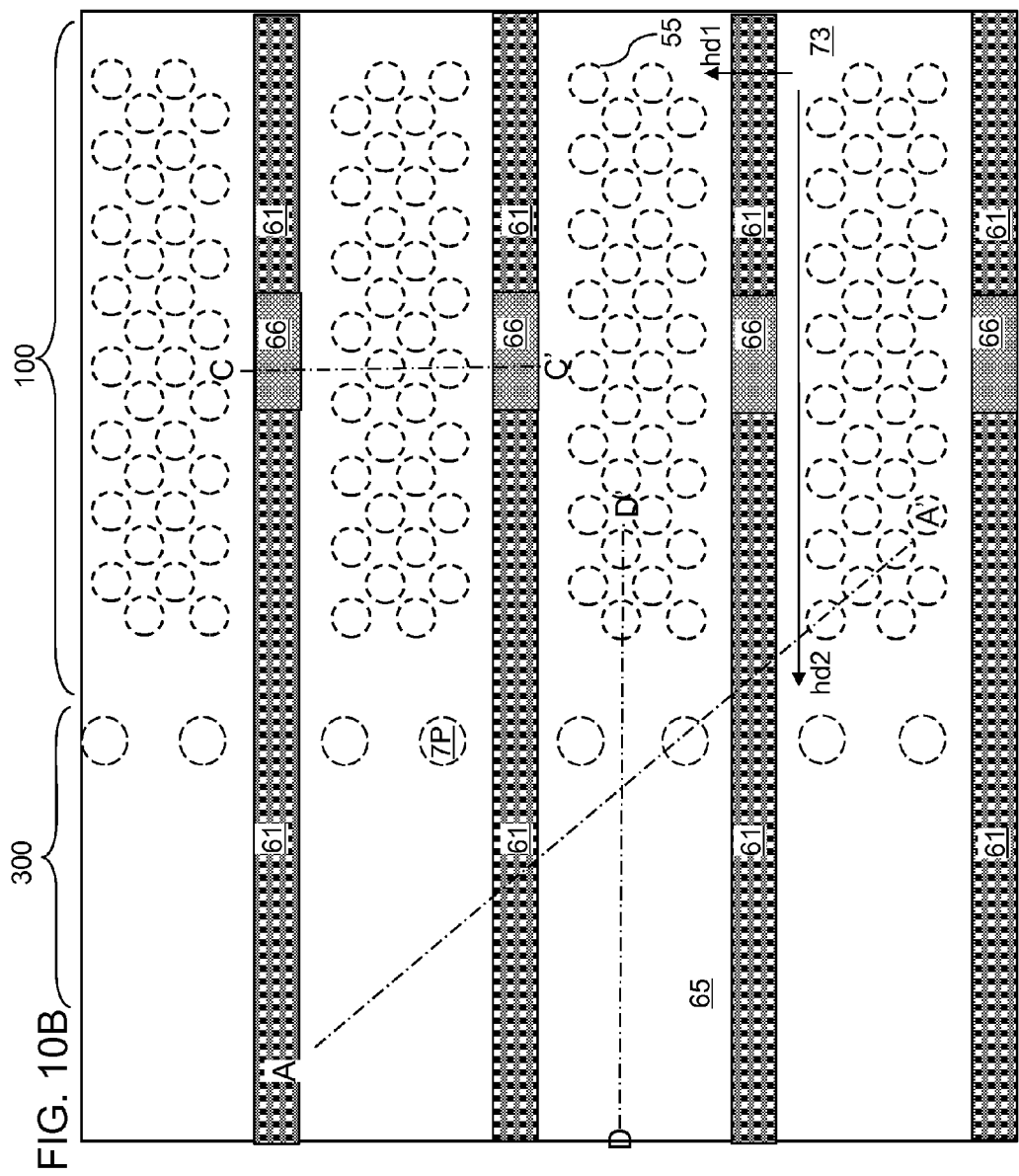
FIG. 10B is a top-down view of the exemplary structure of FIG. 10A with annotations for areas of memory stack structures according to an embodiment of the present disclosure. The vertical plane A-A' corresponds to the plane of the vertical cross-sectional view of FIG. 10A.
Figure 10C:
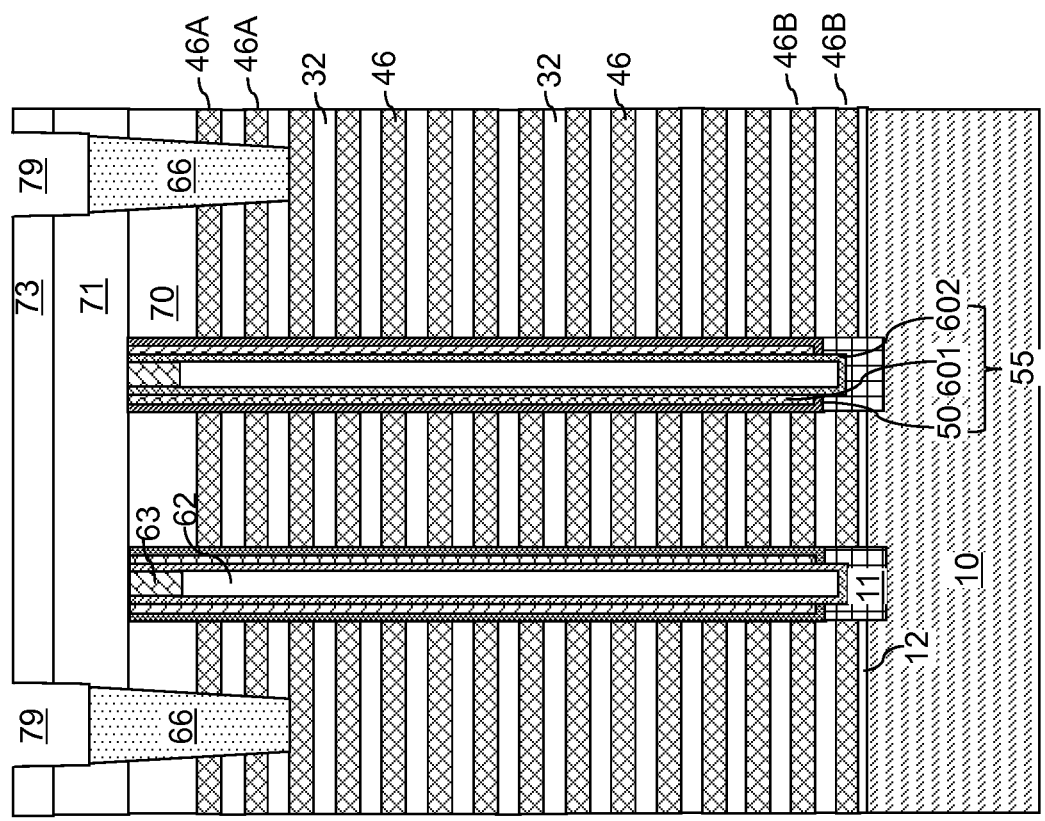
FIG. 10C is a vertical cross-sectional view of the exemplary structure of FIG. 10B along the vertical plane C-C'.
Figure 10D:
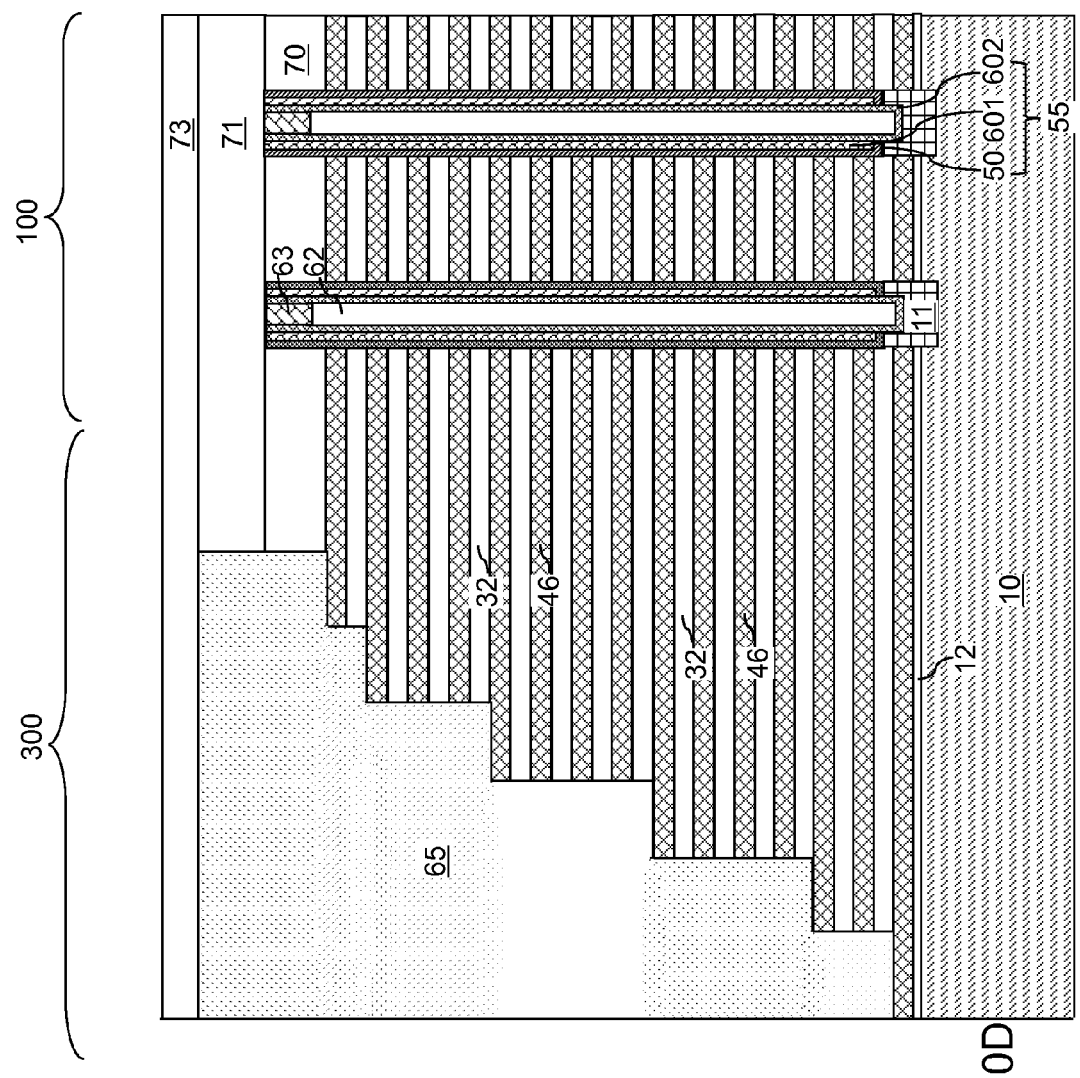
FIG. 10D is a vertical cross-sectional view of the exemplary structure of FIG. 10B along the vertical plane D-D'.

In an illustrative example, n can be 4, and the first set R1 of stepped surfaces can include a first set of vertically coincident sidewalls of a first subset of the spacer material layers 42 that are located at first set of levels (which can include the levels of the (4k+1)-th spacer material layers 42 as counted above the topmost spacer material layer employed for source select gate electrodes for non-negative integers k); the second set R2 of stepped surfaces can include a second set of vertically coincident sidewalls of a second subset of the spacer material layers 42 that are located at second set of levels (which can include the levels of the (4k+2)-th spacer material layers 42 as counted above the topmost spacer material layer employed for source select gate electrodes for non-negative integers k); the third set R3 of stepped surfaces can include a third set of vertically coincident sidewalls of a third subset of the spacer material layers 42 that are located at third set of levels (which can include the levels of the (4k+3)-th spacer material layers 42 as counted above the topmost spacer material layer employed for source select gate electrodes for non-negative integers k); and the fourth set R4 of stepped surfaces can include a fourth set of vertically coincident sidewalls of a fourth subset of the spacer material layers 42 that are located at fourth set of levels (which can include the levels of the (4k+4)-th spacer material layers 42 as counted above the topmost spacer material layer employed for source select gate electrodes for non-negative integers k). Each set of levels can be staggered with respect to one another. As used herein, a first set of levels and a second set of levels are staggered if the first set of levels and the second set of levels are vertically offset with respect to each other. For example, the first set of levels can include (4k+1)-th spacer material layers 42 as counted above the topmost spacer material layer employed for source select gate electrodes for non-negative integers k, and the second set of levels can include (4k+2)-th spacer material layers 42 as counted above the topmost spacer material layer employed for source select gate electrodes for non-negative integers k. In this case, the first set of levels and the second set of levels are staggered with respect to each other because the second set of levels are vertically offset from the first set of levels by a single level. As shown in FIGS. 5B and 5E, since the levels are staggered in direction hd1 between each sets of stepped surfaces, the steps have sidewalls 33A, 33B and 33C between adjacent set of stepped surfaces. Each set (R1, R2, R3, R4) of stepped surfaces in region 300 corresponds to and is located adjacent to a respective memory sub-block (102A, 102B, 102C, 102D) within the memory block 102 in region 100.

In one embodiment, different sets (R1, R2, R3, R4) of stepped surfaces can be provided adjacent to different respective memory sub-blocks (102A, 102B, 102C, 102D), i.e., different regions in the memory block 102 that include clusters of memory stack structures 55. After formation of all stepped surfaces, mask material layers employed to form the stepped surfaces can be removed, for example, by ashing. Multiple photoresist layers and/or multiple etch processes can be employed to form the stepped surfaces.

Subsequently, a photoresist layer (not shown) can be applied over the first contact level dielectric layer 71, and can be lithographically patterned to form openings within areas between the memory blocks. In one embodiment, the memory blocks 102 and the memory sub-blocks (102A, 102B, 102C, 102D) can be laterally spaced from one another along a first horizontal direction hd1, and the dimension of each opening in the photoresist layer along the first horizontal direction hd1 can be less than the spacing between neighboring clusters (i.e., sub-blocks or sets) of memory stack structures 55 along the first horizontal direction hd1. Further, the dimension of each opening in the photoresist layer along a second horizontal direction hd2 (which is parallel to the lengthwise direction of each cluster of memory stack structures 55) can be less than the extent of each cluster of memory stack structures 55 along the second direction.

The patterns of the openings in the photoresist layer can be transferred into the first contact level dielectric layer 71 and into the spacer material layers 42 that are located at the levels of drain select gate electrodes, i.e., into each spacer material layer 42 that is formed at the levels of the drain select gate electrodes. An isolation trench 59 is formed underneath each opening in the photoresist layer through the first contact level dielectric layers 71 and through a subset of the layers of the alternating stack (32, 42), which is located at the levels of drain select gate electrodes. The isolation trench 59 is formed between each pair of adjacent memory sub-blocks in each memory block. However, an isolation trench 59 is preferably not formed between adjacent memory blocks (i.e., between the edge sub-block in one memory block and the opposite end sub-block of the adjacent memory block). The photoresist layer can be subsequently removed, for example, by ashing.

Referring to FIGS. 6A-6D, a dielectric material such as silicon oxide is deposited in the stepped cavity 69 and the isolation trenches 59. Excess portions of the deposited dielectric material can be removed from above the top surface of the first contact level dielectric layer 71, for example, by chemical mechanical planarization (CMP). The remaining portion of the deposited dielectric material filling the stepped cavity 69 constitutes a retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. Each remaining portion of the dielectric material in an isolation trench 59 constitutes an isolation dielectric structure 66. The retro-stepped dielectric material portion 65 and the isolation dielectric structures 66 can have the same composition. If silicon oxide is employed as the dielectric material, the silicon oxide of the retro-stepped dielectric material portion 65 and the isolation dielectric structures 66 may, or may not, be doped with dopants such as B, P, and/or F. The isolation dielectric structures 66 provide electrical isolation between drain side select electrodes to be formed within adjacent memory sub-blocks in the same memory block. However, the isolation dielectric structures 66 are preferably not formed between adjacent memory blocks (i.e., between the edge sub-block in one memory block and the opposite end sub-block of the adjacent memory block).

Referring to FIGS. 7A-7D, at least one dielectric support pillar 7P may be optionally formed through the retro-stepped dielectric material portion 65 and/or through the first contact level dielectric layer 71 and/or through the alternating stack (32, 42). The plane A-A' in FIG. 7B corresponds to the plane of the vertical cross-sectional view of FIG. 7A. In one embodiment, the at least one dielectric support pillar 7P can be formed in the contact region 300, which is located adjacent to the device region 100. The at least one dielectric support pillar 7P can be formed, for example, by forming an opening extending through the retro-stepped dielectric material portion 65 and/or through the alternating stack (32, 42) and at least to the top surface of the substrate 10, and by filling the opening with a dielectric material that is resistant to the etch chemistry to be employed to remove the sacrificial material layers 42.

In one embodiment, the at least one dielectric support pillar 7P can include silicon oxide and/or a dielectric metal oxide such as aluminum oxide. In one embodiment, the portion of the dielectric material that is deposited over the first contact level dielectric layer 71 concurrently with deposition of the at least one dielectric support pillar 7P can be present over the first contact level dielectric layer 71 as a second contact level dielectric layer 73. Each of the at least one dielectric support pillar 7P and the second contact level dielectric layer 73 is an optional structure. As such, the second contact level dielectric layer 73 may, or may not, be present over the insulating cap layer 70 and the retro-stepped dielectric material portion 65. The first contact level dielectric layer 71 and the second contact level dielectric layer 73 are herein collectively referred to as at least one contact level dielectric layer (71, 73). In one embodiment, the at least one contact level dielectric layer (71, 73) can include both the first and second contact level dielectric layers (71, 73), and optionally include any additional via level dielectric layer that can be subsequently formed. In another embodiment, the at least one contact level dielectric layer (71, 73) can include only the first contact level dielectric layer 71 or the second contact level dielectric layer 73, and optionally include any additional via level dielectric layer that can be subsequently formed. Alternatively, formation of the first and second contact level dielectric layers (71, 73) may be omitted, and at least one via level dielectric layer may be subsequently formed, i.e., after formation of a backside contact via structure.

The second contact level dielectric layer 73 and the at least one dielectric support pillar 7P can be formed as a single contiguous structure of integral construction, i.e., without any material interface therebetween. In another embodiment, the portion of the dielectric material that is deposited over the first contact level dielectric layer 71 concurrently with deposition of the at least one dielectric support pillar 7P can be removed, for example, by chemical mechanical planarization or a recess etch. In this case, the second contact level dielectric layer 73 is not present, and the top surface of the first contact level dielectric layer 71 can be physically exposed.

Referring to FIGS. 8A-8D, backside contact trenches 79 can be formed between the memory blocks and between the memory sub-blocks containing clusters of memory stack structures 55. In one embodiment, each backside contact trench 79 can extend along the second horizontal direction hd2 so that the sub-blocks (e.g., clusters of the memory stack structures 55) are laterally spaced along the first horizontal direction hd1. Each cluster of memory stack structures 55 in conjunction with the portions of the alternating stack (32, 42) constitutes a memory sub-block. Each memory sub-block is laterally spaced from one another by the backside contact trenches 79. Each memory sub-block in the same memory block is interconnected to one another through the bridge regions (i.e., connection portions) 104 of the alternating stack (32, 42) that underlie the isolation dielectric structures 66. Thus, the backside contact trenches 79 located between adjacent sub-blocks in the same block comprise several portions separated by the gaps corresponding to the bridge regions 104. In contrast, the adjacent memory blocks are not interconnected to one another through the bridge regions 104. Thus, the backside contact trenches 79 located between adjacent sub-blocks in different blocks (i.e., trenches located between adjacent memory blocks) are continuous (i.e., comprise a single trench) and are not composed of several portions separated by gaps corresponding to the bridge regions 104.

Each backside contact trench 79 can be formed such that the backside contact trench 79 includes at least first and second portions, such as at least two deep portions 79D in which a top surface of the substrate 10 (e.g., substrate semiconductor layer) is physically exposed and a shallow portion 79S which is shallower than the deep portions 79D. The shallow portion 79S is laterally connected to each of the two deep portions 79D and having a bottom surface located above a horizontal plane including a top surface of the alternating stack (32, 42). The shallow portion 79S of the backside contact trench 79 overlies the isolation dielectric structure 66. The bottom surface of the shallow portion 79S can be a top surface of an isolation dielectric structure 66, which may, or may not, be vertically recessed with respect to an original top surface of the isolation dielectric structure 66. Sidewalls of the isolation dielectric structure 66 are physically exposed to the two deep portions 79D of the backside contact trench 79. In an alternative embodiment, the shallow portions 79S are omitted.

The backside contact trenches 79 can be formed, for example, by forming deep portions that extend to the top surface of the semiconductor material layer 10 and shallow portions that do not extend to any of the spacer material layers 42. For example, bottom surfaces of the shallow portions of the backside contact trenches 79 can be located below a horizontal plane including the top surface of the second contact level dielectric layer 73 and another horizontal plane including the bottom surface of the insulating cap layer 70. In one embodiment, the bottom surface of the shallow portions of the backside contact trenches 79 can be located at the same level as the interface between the first and second contact level dielectric layers (71, 73), or can be located between the horizontal plane including the top surface of the first contact level dielectric layer 71 and the horizontal plane including the bottom surface of the insulating cap layer 70 by recessing top portions of the isolation dielectric structures 66.

In one embodiment, the backside contact trenches 79 can be formed by a combination of two lithographic processes and two anisotropic etches. For example, the backside contact trenches 79 can be formed by applying a first photoresist layer over the second contact level dielectric layer 73 and lithographically patterning the first photoresist layer to form openings in areas that are located between the clusters of the memory stack structures 55 and not overlying the isolation dielectric structures 66, transferring by a first anisotropic etch (such as a reactive ion etch) the pattern of the openings in the first photoresist layer through the first and second contact level dielectric layers (71, 72), the retro-stepped dielectric material portion 65, and the alternating stack (32, 42) to the top surface of the semiconductor material layer 10. Subsequently, a second photoresist layer can be applied over the exemplary structure (while filling the trenches formed by the first anisotropic etch), and can be lithographically patterned to form openings that overlie the isolation dielectric structures 66. The pattern in the second photoresist layer can be subsequently transferred through the second contact level dielectric layer 73, and optionally into an upper portion of each isolation dielectric structure 66 by a second anisotropic etch (which can be another reactive ion etch). In an alternative embodiment the trenches 79 may be formed by a single lithographic step and a single etching step. In this embodiment, the material of each isolation dielectric structure 66 is chosen so that it acts as an etch stop and is not etched during the etching of the trenches 79. For example, each isolation dielectric structure 66 may comprise a metal oxide insulating material, such as aluminum oxide. In another alternative embodiment, the shallow portions 79S of the trenches 79 are omitted. In this case, the remaining deep portions 79D of the trenches 79 may be formed by a single lithographic step and a single etching step.

In one embodiment, source regions 61 can be formed at the bottom of the deep portions of the backside contact trenches 79 by implantation of dopants of a second conductivity type (which is the opposite of the first conductivity type) after formation of the deep portions of the backside contact trenches 79. For example, if the first conductivity type is p-type, the second conductivity type is n-type, and vice versa.

Referring to FIGS. 9A-9D, in case the spacer material layers are sacrificial material layers 42, an etchant that selectively etches the second material of the sacrificial material layers 42 with respect to the first material of the insulating layers 32 can be introduced into the backside contact trenches 79, for example, employing an etch process. Backside recesses 43 are formed in volumes from which the sacrificial material layers 42 are removed. The removal of the second material of the sacrificial material layers 42 can be selective to the first material of the insulating layers 32, the material of the at least one dielectric support pillar 7P, the material of the retro-stepped dielectric material portion 65, the semiconductor material of the semiconductor material layer 10, and the material of the outermost layer of the memory films 50. In one embodiment, the sacrificial material layers 42 can include silicon nitride, and the materials of the insulating layers 32, the at least one dielectric support pillar 7P, and the retro-stepped dielectric material portion 65 can be selected from silicon oxide and dielectric metal oxides. In another embodiment, the sacrificial material layers 42 can include a semiconductor material such as polysilicon, and the materials of the insulating layers 32, the at least one dielectric support pillar 7P, and the retro-stepped dielectric material portion 65 can be selected from silicon oxide, silicon nitride, and dielectric metal oxides. In this case, the depth of the backside contact trenches 79 can be modified so that the bottommost surface of the backside contact trenches 79 is located within the gate dielectric layer 12, i.e., to avoid physical exposure of the top surface of the semiconductor substrate layer 10.

The etch process that removes the second material selective to the first material and the outermost layer of the memory films 50 can be a wet etch process employing a wet etch solution, or can be a gas phase (dry) etch process in which the etchant is introduced in a vapor phase into the backside contact trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The at least one dielectric support pillar 7P, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side recesses or front side cavities in contrast with the backside recesses 43. In one embodiment, the device region 100 comprises an array of monolithic three-dimensional NAND strings having a plurality of device levels disposed above the substrate 10. In this case, each backside recess 43 can define a space for receiving a respective word line of the array of monolithic three-dimensional NAND strings.

Each of the plurality of backside recesses 43 can extend substantially parallel to the top surface of the substrate 10. A backside recess 43 can be vertically bounded by a top surface of an underlying insulating layer 32 and a bottom surface of an overlying insulating layer 32. In one embodiment, each backside recess 43 can have a uniform height throughout. Optionally, a backside blocking dielectric layer can be formed in the backside recesses.

Referring to FIGS. 10A-10D, physically exposed surface portions of epitaxial channel portions 11 and the source regions 61 can be converted into dielectric material portions by thermal conversion and/or plasma conversion of the semiconductor materials into dielectric materials. For example, thermal conversion and/or plasma conversion can be employed to convert a surface portion of each epitaxial channel portion 11 into a dielectric spacer 116, and to convert a surface portion of each source region 61 into a sacrificial dielectric portion 616. In one embodiment, each dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The dielectric spacers 116 include a dielectric material that includes the same semiconductor element as the epitaxial channel portions 11 and additionally includes at least one non-metallic element such as oxygen and/or nitrogen such that the material of the dielectric spacers 116 is a dielectric material. In one embodiment, the dielectric spacers 116 can include a dielectric oxide, a dielectric nitride, or a dielectric oxynitride of the semiconductor material of the epitaxial channel portions 11. Likewise, each sacrificial dielectric portion 616 includes a dielectric material that includes the same semiconductor element as the source regions 61 and additionally includes at least one non-metallic element such as oxygen and/or nitrogen such that the material of the sacrificial dielectric portions 616 is a dielectric material. In one embodiment, the sacrificial dielectric portions 616 can include a dielectric oxide, a dielectric nitride, or a dielectric oxynitride of the semiconductor material of the source region 61.

A backside blocking dielectric layer (not shown) can be optionally formed. The backside blocking dielectric layer, if present, comprises a dielectric material that functions as a control gate dielectric for the control gates to be subsequently formed in the backside recesses 43. In case at least one blocking dielectric (501, 503) is present within each memory stack structure 55, the backside blocking dielectric layer is optional. In case a blocking dielectric is not present in the memory stack structures 55, the backside blocking dielectric layer is present.

At least one metallic material can be deposited in the plurality of backside recesses 43, on the sidewalls of the backside contact trenches 79, and over the top surface of the second contact level dielectric layer 73. As used herein, a metallic material refers to an electrically conductive material that includes at least one metallic element.

The metallic material can be deposited by a conformal deposition method, which can be, for example, chemical vapor deposition (CVD), atomic layer deposition (ALD), electroless plating, electroplating, or a combination thereof. The metallic material can be an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. Non-limiting exemplary metallic materials that can be deposited in the plurality of backside recesses 43 include tungsten, tungsten nitride, titanium, titanium nitride, tantalum, tantalum nitride, cobalt, and ruthenium. In one embodiment, the metallic material can comprise a metal such as tungsten and/or metal nitride. In one embodiment, the metallic material for filling the plurality of backside recesses 43 can be a combination of titanium nitride layer and a tungsten fill material.

In one embodiment, the metallic material can be deposited by chemical vapor deposition or atomic layer deposition. In one embodiment, the metallic material can be employing at least one fluorine-containing precursor gas as a precursor gas during the deposition process. In one embodiment, the molecule of the at least one fluorine-containing precursor gas cam comprise a compound of at least one tungsten atom and at least one fluorine atom. For example, if the metallic material includes tungsten, $WF_6$ and $H_2$ can be employed during the deposition process.

A plurality of electrically conductive layers 46 can be formed in the plurality of backside recesses 43, and a contiguous metallic material layer (not shown) can be formed on the sidewalls of each backside contact trench 79 and over the at least one contact level dielectric layer (71, 73). Thus, each sacrificial material layer 42 can be replaced with an electrically conductive layer 46. A backside cavity is present in the portion of each backside contact trench 79 that is not filled with the backside blocking dielectric layer and the contiguous metallic material layer.

The deposited metallic material of the contiguous metallic material layer is subsequently etched back from the sidewalls of each backside contact trench 79 and from above the second contact level dielectric layer 73, for example, by an isotropic etch. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

A subset of the electrically conductive layers 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, one subset of the electrically conductive layers 46 can be a word line that functions as a common control gate electrode for the plurality of vertical memory devices in different memory sub-blocks in one memory block. Another subset of the electrically conductive layers 46A can be a common drain side select gate electrode for the plurality of vertical memory devices. Another subset of the electrically conductive layers 46B can be a common source side select gate electrode for the plurality of vertical memory devices. Optionally, the sacrificial dielectric portions 616 can be removed from above the source regions 61 during the last processing step of the anisotropic etch.

Referring to FIGS. 11A-11E, an insulating material layer can be formed in the backside contact trenches 79 and over the second contact level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. The thickness of the insulating material layer can be in a range from 1.5 nm to 60 nm, although lesser and greater thicknesses can also be employed.

Subsequently, an anisotropic etch is performed to remove horizontal portions of the insulating material layer and to optionally remove the horizontal portion of the backside blocking dielectric layer from above the second contact level dielectric layer 73. Each remaining portion of the insulating material layer inside a backside contact trench 79 constitutes a vertically elongated annular structure with a vertical cavity therethrough, which is herein referred to as an insulating spacer 74. In one embodiment, an annular bottom surface of the insulating spacer 74 contacts a top surface of the source region 61.

Each insulating spacer 74 can be formed over the sidewalls of the backside contact trench 79, and can be formed directly on substantially vertical sidewalls of the backside blocking dielectric layer and directly on the sidewalls of the electrically conductive layers 46, i.e., directly on the sidewalls of the metallic material portions 46. The thickness of each insulating spacer 74, as measured at a bottom portion thereof, can be in a range from 1.5 nm to 60 nm, although lesser and greater thicknesses can also be employed. In one embodiment, the thickness of the insulating spacer 74 can be in a range from 3 nm to 10 nm. Each insulating spacer 74 laterally surrounds a backside cavity 79'.

Photolithographic processes and anisotropic etch processes can be repeatedly employed to form various via cavities that extend from the top surface of the at least one contact level dielectric layer (73, 72) to various conductive elements within the exemplary structure. For example, memory contact via cavities can be formed over each memory stack structure 55 in the device region 100. Control gate via cavities can be formed over the stepped surfaces of the contact region 300. Peripheral device contact via cavities can be formed to various elements of semiconductor devices (such as field effect transistors) in the peripheral device region. At least one conductive material, which can include a metallic liner (such as TiN, TaN, or WN) and a conductive fill material (such as W, Cu, Al, Co, Ru, or a combination thereof), can be deposited in the various via cavities, and can be subsequently planarized, for example, by chemical mechanical planarization (CMP). Remaining portions of the at least one conductive material filling the various via cavities constitute various contact via structures. The various contact via structures can include, for example, backside contact via structures 76 (e.g., source electrode/local interconnect or source line) filling the backside contact trenches, memory contact via structures 88 (i.e., drain electrodes/local interconnects or bit lines) filling the memory contact via cavities and contacting the drains 63 over the memory stack structures 55, control gate contact via structures (861, 862, 863, 864) that contact a subset of the electrically conductive layers 46 that function as control gate electrodes, source select contact via structures 82 that contact a subset of the electrically conductive layers 46B that function as source select gate electrodes, and drain select contact via structures 84 that contact a subset of the electrically conductive layers 46A that function as drain select gate electrodes. Respective bit lines and one or more source lines (not shown for clarity) may be located above layer 73 and electrically contact respective structures 88 and 76.

The exemplary structure of the present disclosure can include a monolithic three-dimensional memory device comprising a plurality of memory sub-blocks (102A, 102B, 102C, 102D) located on a substrate 10. Each memory sub-block (102A, 102B, 102C, 102D) comprises a set of memory stack structures 55 and a portion of alternating layers (32, 46) laterally surrounding the set of memory stack structures 55. The alternating layers (32, 42) comprise insulating layers 32 and electrically conductive layers 46. First portions of a neighboring pair of memory sub-blocks in the same memory block are laterally spaced from each other along a first horizontal direction hd1 by a backside contact via structure 76 and word lines/control gate electrodes in second portions of the neighboring pair of memory sub-blocks in the same memory block are electrically connected to each other in the bridge region 104.

A first subset of the alternating layers (32, 46), i.e., a subset including at least all of the electrically conductive layers 46 that function as control gate electrodes and the insulating layers 32 therebetween, contiguously extends between the neighboring pair of memory sub-blocks through a gap in the bridge region 104 between two portions 76D of the backside contact via structure 76 that are laterally spaced apart along a second horizontal direction hd2 to provide a connecting portion (i.e., a bridge) between the neighboring pair of memory sub-blocks in the same block. However, the subset including at least all of the electrically conductive layers 46 that function as control gate electrodes and the insulating layers 32 there between, do not contiguously extend between the neighboring pair of memory sub-blocks in different blocks. In one embodiment, the backside contact via structure 76 can be of unitary construction, i.e., be a single contiguous structure, and includes a bridge portion 76B that overlies a portion of the alternating layers (32, 42) that are located at the gap. An isolation dielectric structure 66 comprising a dielectric material can underlie the bridge portion 76B of structure 76 and overly the bridge region 104. The isolation dielectric structure 66 can contact sidewalls of a second subset of the alternating layers (32, 42) that are located above the first subset of the alternating layers (32, 42) in the bridge region 104, i.e., can contact the subset of the alternating layers (32, 42) that include the electrically conductive layers 46A that are employed as drain select gate electrodes and the insulator layers 32 therebetween.

An insulating spacer 74 can laterally surround each backside contact structure 76. The insulating spacer 74 can contact sidewalls of the first subset of the alternating layers (32, 42) and the sidewalls of the second subset of the alternating layers (32, 42). The insulating spacer 74 contacts sidewalls of the isolation dielectric structure 66. A bottom surface of the bridge portion 76B can be located within a horizontal plane overlying the topmost surface of the alternating stack (32, 46).

At least one contact level dielectric layer (71, 73) overlies the alternating layers (32, 46) and the sets of memory stack structures 55. A top surface of the backside contact via structure 76 can be coplanar with the topmost surface of the at least one contact level dielectric layer (71, 73). Each memory stack structure 55 can extend through the alternating stack (32, 42), and can comprise, from outside to inside at least one blocking dielectric (501, 503), a memory material layer 504, a tunneling dielectric 506, and a vertical semiconductor channel (601, 602) contacting an overlying drain region 63. Source regions 61 can underlie the backside contact via structures 76. The source regions 61 can be located in, or on, the substrate 10. A semiconductor channel contiguously extends between each drain region 63 and one of the source regions 61.

A retro-stepped dielectric material portion 65 can be have sidewalls, each of which contacts a plurality of electrically conductive layers 46 within the alternating stack. In one embodiment, a first memory sub-block (e.g., 102A) within the neighboring pair of memory sub-blocks (e.g., 102A and 102B) includes a first set of vertically coincident sidewalls of a first subset of the electrically conductive layers 46 located at first set of levels (which can be, for example, a first level of control gate electrodes as counted from the bottom, a fifth level, a ninth level, etc.), and a second memory sub-block (e.g., 102B) within the neighboring pair of memory sub-blocks (e.g., 102A and 102B) includes a second set of vertically coincident sidewalls of a second subset of the electrically conductive layers 46 located at second set of levels (which can be, for example, a second level of control gate electrodes as counted from the bottom, a sixth level, a tenth level, etc.). The first set of levels and the second set of levels are staggered with respect to each other.

As described above, since the levels are staggered in direction hd1 in each sets of stepped surfaces, the steps have sidewalls 33A, 33B and 33C (shown in FIG. 5E) between adjacent sets of stepped surfaces. Each set (R1, R2, R3, R4) of stepped surfaces in region 300 corresponds to and is located adjacent to a respective memory sub-block (102A, 102B, 102C, 102D) within the memory block 102 in region 100.

Each electrically conductive layer 46 (e.g., word line/ control gate electrode) exposed at the top of a step in one of the sets (R1, R2, R3, R4) of stepped surfaces in region 300 and is contacted by a respective control gate contact via structure (861, 862, 863, 864). The contacted electrically conductive layer 46 (e.g., word line/control gate electrode) extends from one set of stepped surfaces in region 300 into the entire memory block 102 in region 100. The contacted electrically conductive layer 46 (e.g., word line/control gate electrode) is present and is electrically continuous in all memory sub-blocks (102A, 102B, 102C, 102D) of the memory block because it extends between the trenches 79 in the bridge regions 104.

The contacted electrically conductive layer 46 (e.g., word line/control gate electrode) in one set of stepped surfaces in region 300 overlies one or more underlying electrically conductive layers 46 (e.g., word lines/control gate electrodes) in the same set of stepped surfaces. The underlying electrically conductive layers 46 are not contacted by a respective control gate contact via structure (861, 862, 863, 864) in the same set of stepped surfaces. However, since the levels are staggered in direction hd1 in each set of stepped surfaces, each underlying electrically conductive layer 46 in the set is contacted by a respective control gate contact via structure (861, 862, 863, 864) in a different set of stepped surfaces.

Figure 11A:
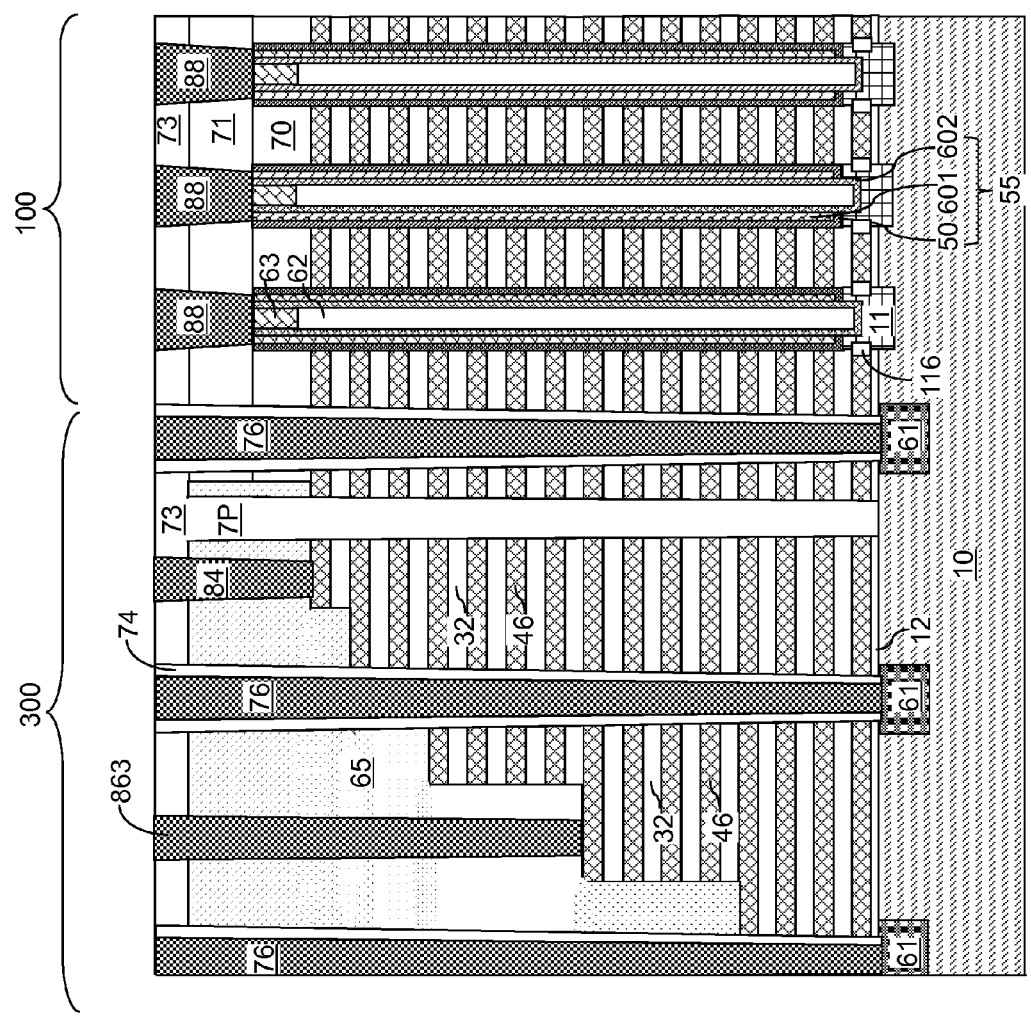
FIG. 11A is a vertical cross-sectional view of the exemplary structure after formation of various contact via structures according to an embodiment of the present disclosure.
Figure 11B:
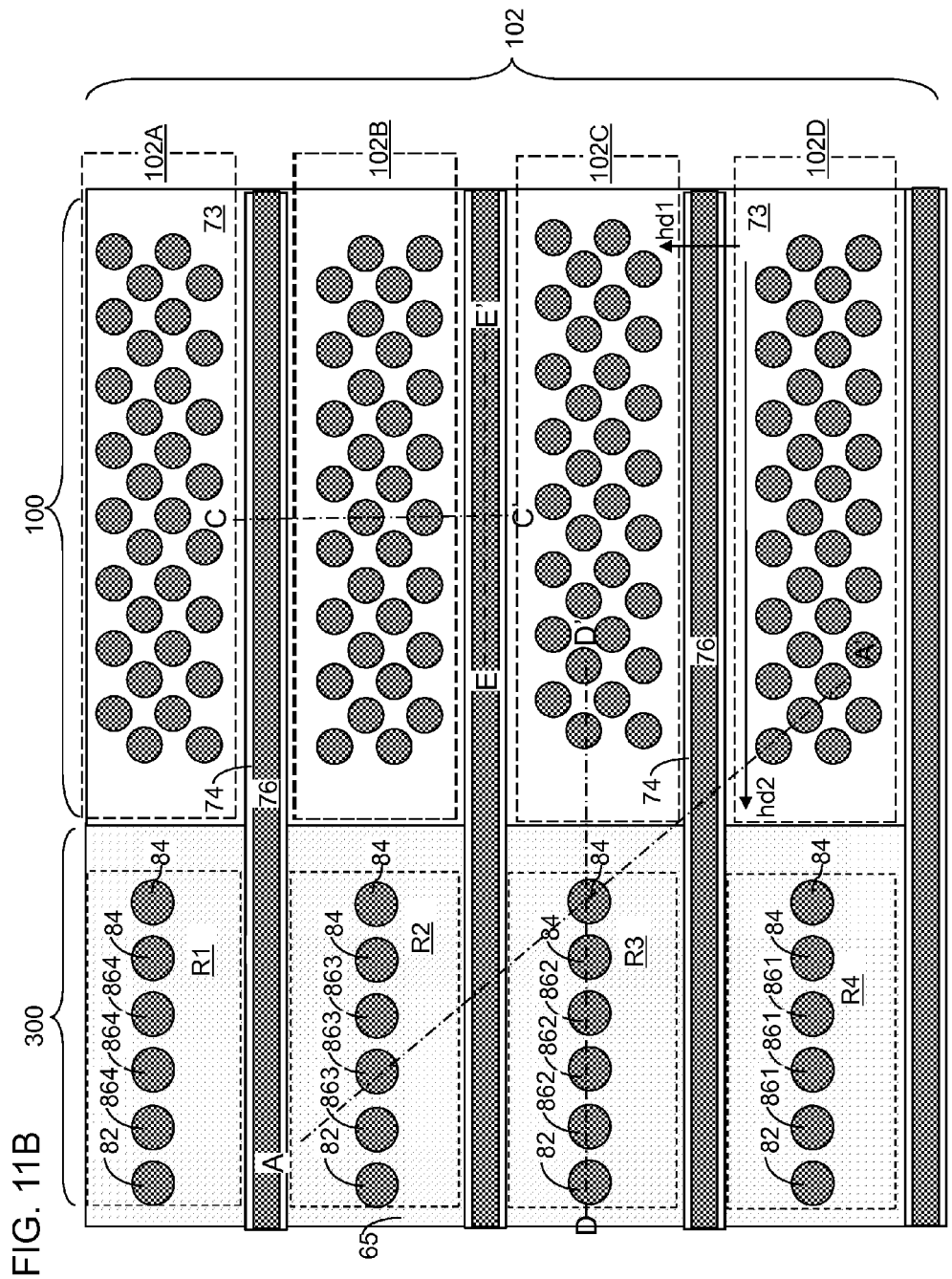
FIG. 11B is a top-down view of the exemplary structure of FIG. 11A according to an embodiment of the present disclosure. The vertical plane A-A' corresponds to the plane of the vertical cross-sectional view of FIG. 11A.
Figure 11C:
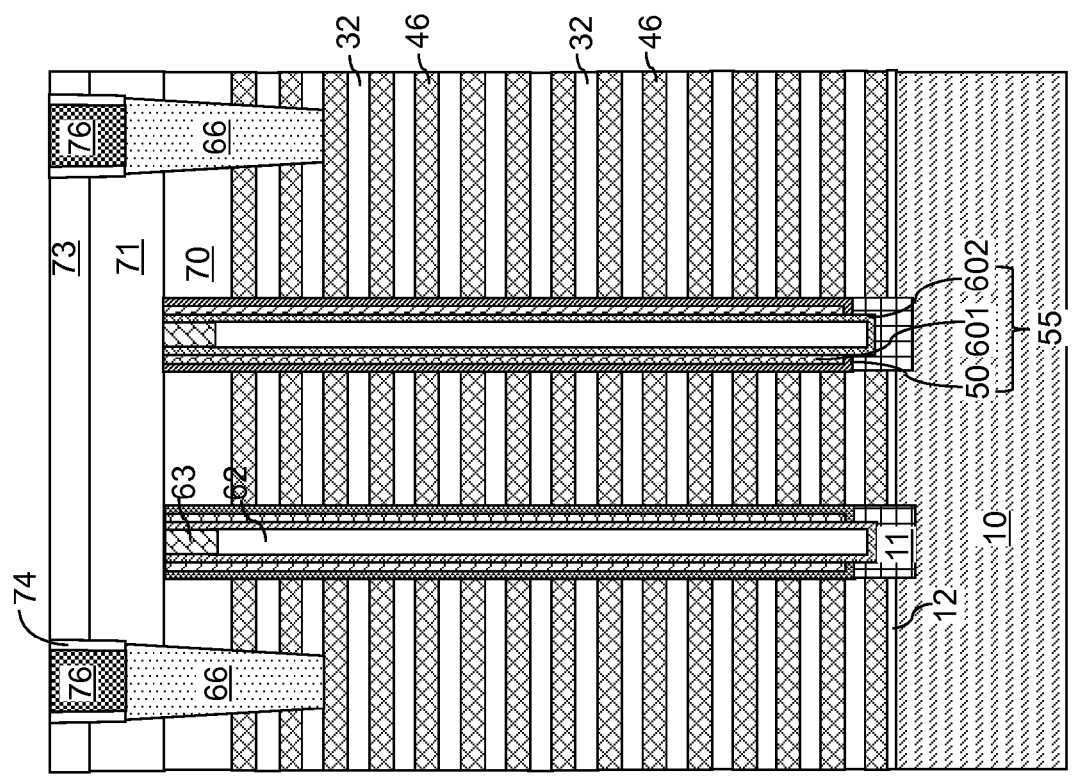
FIG. 11C is a vertical cross-sectional view of the exemplary structure of FIG. 11B along the vertical plane C-C'.
Figure 11D:
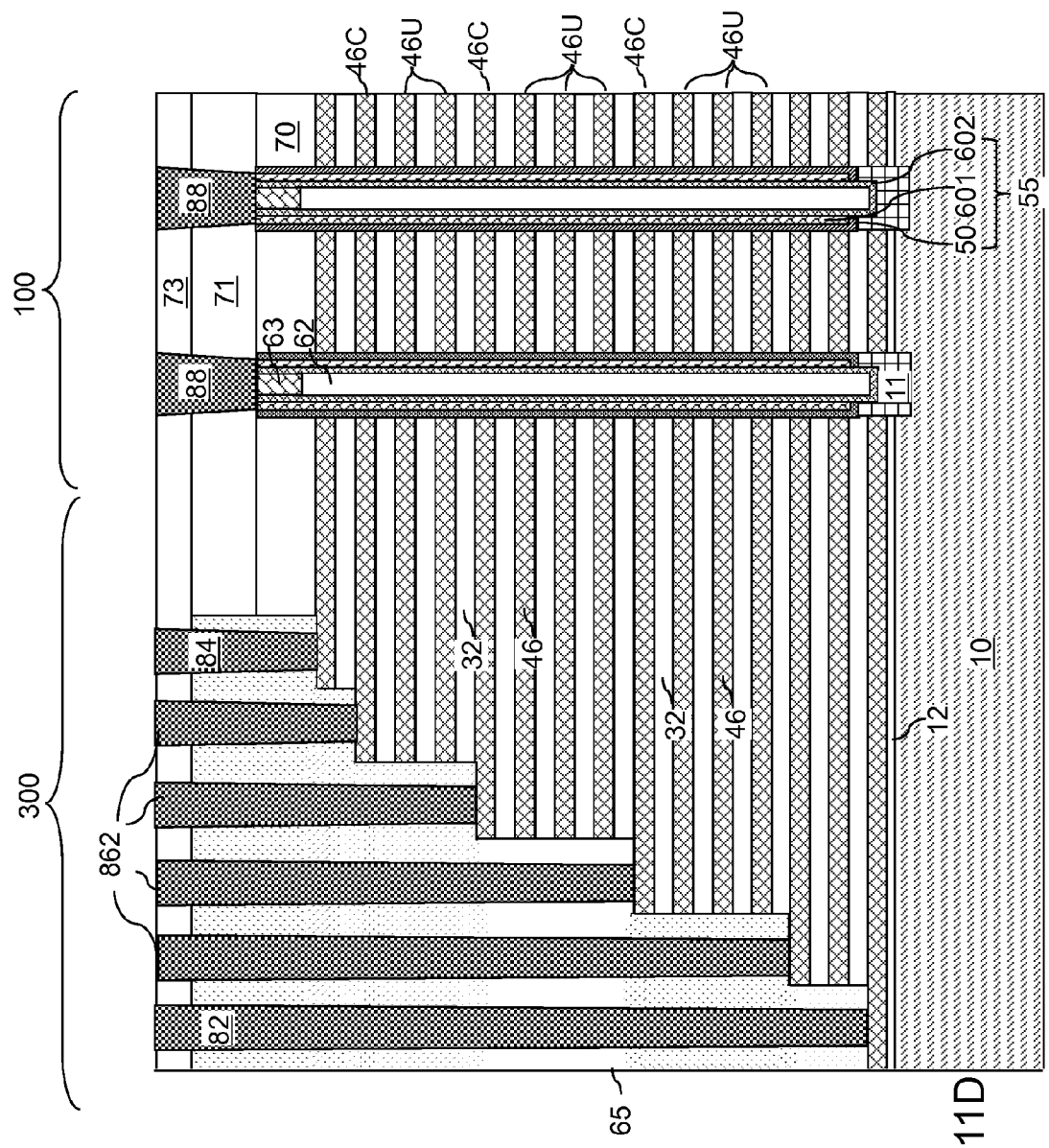
FIG. 11D is a vertical cross-sectional view of the exemplary structure of FIG. 11B along the vertical plane D-D'.
Figure 11E:
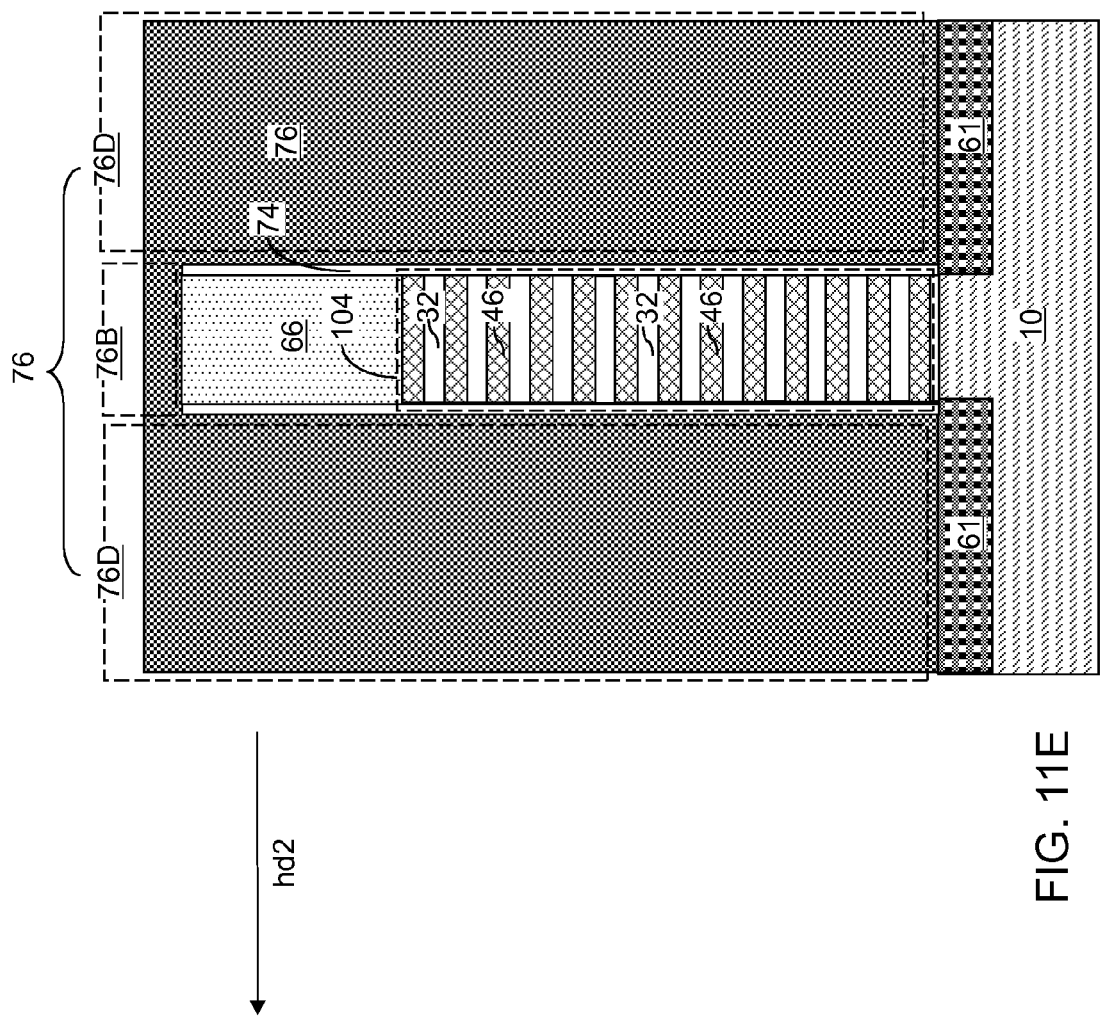
FIG. 11E is a vertical cross-sectional view of the exemplary structure of FIG. 11B along the vertical plane E-E'.

For example, as shown in FIGS. 11A, 11B and 11D, the third set R3 of stepped surfaces in region 300 corresponds to and is located adjacent to a third memory sub-block 102C within the memory block 102 in region 100. Each electrically conductive layer 46C (e.g., word line/control gate electrode) exposed at the top of a step in the third set R3 of stepped surfaces in region 300 and is contacted by a respective control gate contact via structure 862.

The contacted electrically conductive layer 46C extends from set R3 of stepped surfaces in region 300 into adjacent third memory sub-block 102C in region 100. The contacted electrically conductive layer 46C is present and is electrically continuous in all other memory sub-blocks (102A, 102B, 102D) of the same memory block 102 because it extends between the trenches 79 in the bridge regions 104.

The contacted electrically conductive layer 46C in set R3 of stepped surfaces in region 300 overlies one or more underlying electrically conductive layers 46U in the same set R3 of stepped surfaces. The underlying electrically conductive layers 46U are not contacted by the respective control gate contact via structure 862 in the same set R3 of stepped surfaces. However, since the levels are staggered in direction hd1 in each set of stepped surfaces, each underlying electrically conductive layer 46U in set R3 is contacted by a respective control gate contact via structure (861, 863, 864) in a different set (R1, R2, R4) of stepped surfaces.

Furthermore, the top of the stack (32, 46) above the bridge region 104 is etched and an isolation structure 66 is formed between the drain side select gate electrodes such that each drain select gate electrode 46A finger from one (e.g., R3) set of stepped surfaces drives only one adjacent sub-block (e.g., 102C). Thus, each drain side select gate electrode 46A is not electrically continuous in all other memory sub-blocks (102A, 102B, 102D) of the same memory block 102 because it does not extend between the trenches 79 in the bridge regions 104.

The embodiments of the present disclosure are advantageous because they increase stability and reduce toppling of the stack layers in each sub-block. The bridge regions 104 stabilize the stack layers in the sub-blocks and act as a mechanical support for the stack layers. The embodiments of the present disclosure are also advantageous because they reduce the area of the contact region 300, which can in turn reduce the size of the die of the device. Specifically, the bridge regions 104 enable the staggering (i.e., offsetting) of the stepped surfaces such that not every word line/control gate electrode 46 is contacted in each set of stepped surfaces. The staggered stepped surfaces reduce the area of the contact region 300.

In one embodiment, each memory stack structure 55 can include, from outside to inside, at least one blocking dielectric (501, 503), a memory material layer 504, a tunneling dielectric 506, and a semiconductor channel 60 contacting an overlying drain region 63.

In one embodiment, the memory device of the present disclosure can be a monolithic three-dimensional memory device comprising a vertical NAND device located over the substrate 10, and the electrically conductive layers 46 can comprise, or are electrically connected to, a respective word line of the vertical NAND device. The substrate 10 can comprise a silicon substrate. The vertical NAND device can comprise an array of monolithic three-dimensional NAND strings located over the silicon substrate. At least one memory cell in a first device level of the three-dimensional array of NAND strings is located over another memory cell in a second device level of the three-dimensional array of NAND string. The silicon substrate can contain an integrated circuit comprising a driver circuit for the memory device located thereon.

The array of monolithic three-dimensional NAND strings can comprise a plurality of semiconductor channels. At least one end portion of each of the plurality of semiconductor channels extends substantially perpendicular to a top surface of the substrate 10. In one embodiment, the plurality of semiconductor channels can comprise horizontal semiconductor channel portions that include a doped well (which is a portion of the semiconductor material layer 10) located between a source region 61 and the epitaxial channel portions 11, and the vertical semiconductor channels 60 that are portions of the memory stack structures 55. The array of monolithic three-dimensional NAND strings can comprise a plurality of charge storage elements (which can be embodied as sections of a memory material layer 504 that is present within each memory stack structure 55). Each charge storage element can be located adjacent to a respective one of the plurality of semiconductor channels, i.e., adjacent to a respective vertical semiconductor channel 60. The array of monolithic three-dimensional NAND strings can comprise a plurality of control gate electrodes having a strip shape extending substantially parallel to the top surface of the substrate 10. The plurality of control gate electrodes comprise at least a first control gate electrode located in the first device level and a second control gate electrode located in the second device level.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A monolithic three-dimensional memory device comprising a first memory block containing a plurality of memory sub-blocks located on a substrate, wherein:
   each memory sub-block comprises a set of memory stack structures and a portion of alternating layers laterally surrounding the set of memory stack structures;
   alternating layers comprising insulating layers and electrically conductive layers are located over the substrate;
   a first portion of neighboring pair of memory sub-blocks is laterally spaced from each other along a first horizontal direction by a backside contact via structure; and
   a subset of the alternating layers contiguously extends between a second portion of the neighboring pair of memory sub-blocks through a gap in a bridge region between two portions of the backside contact via structure that are laterally spaced apart along a second horizontal direction to provide a connecting portion between the neighboring pair of memory sub-blocks;
   wherein the monolithic three-dimensional memory device further comprises:
   a contact region located adjacent to a device region containing the first memory block;
   a plurality of sets of stepped surfaces in the contact region located adjacent to a respective memory sub-block within the first memory block in the device region;
   a first set of stepped surfaces includes a first set of vertically coincident sidewalls of a first subset of the electrically conductive layers located at a first set of levels;
   a second set of stepped surfaces includes a second set of vertically coincident sidewalls of a second subset of the electrically conductive layers located at a second set of levels;
   the first set of levels and the second set of levels are staggered with respect to each other; and
   a block level backside contact via structure located between the first memory block and a second memory block, wherein there is no gap in the block level backside contact via structure and the alternating layers do not contiguously extend between the memory block and the second memory block.

2. The monolithic three-dimensional memory device of claim 1, wherein:
   the monolithic three-dimensional memory device comprises a vertical NAND device located over the substrate;
   the electrically conductive layers comprise, or are electrically connected to, a respective word line of the vertical NAND device;
   the substrate comprises a silicon substrate;
   the vertical NAND device comprises an array of monolithic three-dimensional NAND strings over the silicon substrate;
   at least one memory cell in a first device level of the array of monolithic three-dimensional NAND strings is located over another memory cell in a second device level of the array of monolithic three-dimensional NAND strings;
   the silicon substrate contains an integrated circuit comprising a driver circuit for the memory device located thereon; and
   the array of monolithic three-dimensional NAND strings comprises:
   a plurality of semiconductor channels, wherein at least one end portion of each of the plurality of semiconductor channels extends substantially perpendicular to a top surface of the substrate;
   a plurality of charge storage elements, each charge storage element located adjacent to a respective one of the plurality of semiconductor channels; and
   a plurality of control gate electrodes having a strip shape extending substantially parallel to the top surface of the substrate, the plurality of control gate electrodes comprise at least a first control gate electrode located in the first device level and a second control gate electrode located in the second device level.

3. The monolithic three-dimensional memory device of claim 1, wherein:
   each electrically conductive layer exposed at a top of a step in a first sets of stepped surfaces in the contact region is contacted by a respective control gate contact via structure;
   the contacted electrically conductive layer extends from the first set of stepped surfaces in the contact region into the first memory block in the contact region such that the contacted electrically conductive layer is present and is electrically continuous in all memory sub-blocks in the first memory block;
   the contacted electrically conductive layer in the first set of stepped surfaces in the contact region overlies one or more underlying electrically conductive in the first set of stepped surfaces;
   the underlying electrically conductive layers are not contacted by the respective control gate contact via structure in the first set of stepped surfaces; and
   each underlying electrically conductive layer in the first set of stepped surfaces is contacted by the respective control gate contact via structure in a different set of stepped surfaces.

4. The monolithic three-dimensional memory device of claim 1, wherein the backside contact via structure is of unitary construction and includes a bridge portion that overlies a portion of the alternating layers that are located in the bridge region.

5. The monolithic three-dimensional memory device of claim 4, further comprising an isolation dielectric structure comprising a dielectric material and underlying the bridge portion, wherein the isolation dielectric structure contacts sidewalls of another subset of the alternating layers that are located above the subset of the alternating layers.

6. The monolithic three-dimensional memory device of claim 5, further comprising an insulating spacer that laterally surrounds the backside contact structure;
wherein the insulating spacer contacts sidewalls of the subset of the alternating layers and the insulating spacer contacts sidewalls of the isolation dielectric structure.

7. The monolithic three-dimensional memory device of claim 4, further comprising at least one contact level dielectric layer overlying the alternating layers and the sets of memory stack structures;
wherein a top surface of the backside contact via structure is coplanar with a topmost surface of the at least one contact level dielectric layer; and
wherein a bottom surface of the bridge portion is located within a horizontal plane overlying a topmost surface of the alternating stack.

8. The monolithic three-dimensional memory device of claim 1, wherein each memory stack structure extends through the alternating stack and comprises, from outside to inside:
at least one blocking dielectric,
a memory material layer,
a tunneling dielectric, and
a vertical semiconductor channel contacting an overlying drain region.

9. The monolithic three-dimensional memory device of claim 8, further comprising a retro-stepped dielectric material portion having a sidewall that contacts a plurality of electrically conductive layers within the alternating stack, and source regions underlying the backside contact via structures and located in, or on, the substrate;
wherein a semiconductor channel contiguously extends between each drain region and one of the source regions; and
wherein backside contact via structures comprise source electrodes or source side local interconnects.

10. A monolithic three-dimensional memory device comprising a first memory block containing a plurality of memory sub-blocks located on a substrate, wherein:
each memory sub-block comprises a set of memory stack structures and a portion of alternating layers laterally surrounding the set of memory stack structures;
alternating layers comprising insulating layers and electrically conductive layers are located over the substrate;
a first portion of neighboring pair of memory sub-blocks is laterally spaced from each other along a first horizontal direction by a backside contact via structure; and
a subset of the alternating layers contiguously extends between a second portion of the neighboring pair of memory sub-blocks through a gap in a bridge region between two portions of the backside contact via structure that are laterally spaced apart along a second horizontal direction to provide a connecting portion between the neighboring pair of memory sub-blocks;
wherein the monolithic three-dimensional memory device further comprises:
a contact region located adjacent to a device region containing the first memory block;
a plurality of sets of stepped surfaces in the contact region located adjacent to a respective memory sub-block within the first memory block in the device region;
a first set of stepped surfaces includes a first set of vertically coincident sidewalls of a first subset of the electrically conductive layers located at a first set of levels;
a second set of stepped surfaces includes a second set of vertically coincident sidewalls of a second subset of the electrically conductive layers located at a second set of levels; and
the first set of levels and the second set of levels are staggered with respect to each other, wherein:
each electrically conductive layer exposed at a top of a step in a first sets of stepped surfaces in the contact region is contacted by a respective control gate contact via structure;
the contacted electrically conductive layer extends from the first set of stepped surfaces in the contact region into the first memory block in the contact region such that the contacted electrically conductive layer is present and is electrically continuous in all memory sub-blocks in the first memory block;
the contacted electrically conductive layer in the first set of stepped surfaces in the contact region overlies one or more underlying electrically conductive in the first set of stepped surfaces;
the underlying electrically conductive layers are not contacted by the respective control gate contact via structure in the first set of stepped surfaces; and
each underlying electrically conductive layer in the first set of stepped surfaces is contacted by the respective control gate contact via structure in a different set of stepped surfaces.

11. The monolithic three-dimensional memory device of claim 10, further comprising a block level backside contact via structure located between the first memory block and a second memory block, wherein there is no gap in the block level backside contact via structure and the alternating layers do not contiguously extend between the memory block and the second memory block.

12. The monolithic three-dimensional memory device of claim 10, wherein:
the monolithic three-dimensional memory device comprises a vertical NAND device located over the substrate;
the electrically conductive layers comprise, or are electrically connected to, a respective word line of the vertical NAND device;
the substrate comprises a silicon substrate;
the vertical NAND device comprises an array of monolithic three-dimensional NAND strings over the silicon substrate;
at least one memory cell in a first device level of the array of monolithic three-dimensional NAND strings is located over another memory cell in a second device level of the array of monolithic three-dimensional NAND strings;
the silicon substrate contains an integrated circuit comprising a driver circuit for the memory device located thereon; and
the array of monolithic three-dimensional NAND strings comprises:
a plurality of semiconductor channels, wherein at least one end portion of each of the plurality of semiconductor channels extends substantially perpendicular to a top surface of the substrate;
a plurality of charge storage elements, each charge storage element located adjacent to a respective one of the plurality of semiconductor channels; and
a plurality of control gate electrodes having a strip shape extending substantially parallel to the top surface of the substrate, the plurality of control gate electrodes comprise at least a first control gate electrode located in the first device level and a second control gate electrode located in the second device level.

13. The monolithic three-dimensional memory device of claim 10, wherein the backside contact via structure is of unitary construction and includes a bridge portion that overlies a portion of the alternating layers that are located in the bridge region.

14. The monolithic three-dimensional memory device of claim 13, further comprising an isolation dielectric structure comprising a dielectric material and underlying the bridge portion, wherein the isolation dielectric structure contacts sidewalls of another subset of the alternating layers that are located above the subset of the alternating layers.

15. The monolithic three-dimensional memory device of claim 14, further comprising an insulating spacer that laterally surrounds the backside contact structure;
wherein the insulating spacer contacts sidewalls of the subset of the alternating layers and the insulating spacer contacts sidewalls of the isolation dielectric structure.

16. The monolithic three-dimensional memory device of claim 13, further comprising at least one contact level dielectric layer overlying the alternating layers and the sets of memory stack structures;
wherein a top surface of the backside contact via structure is coplanar with a topmost surface of the at least one contact level dielectric layer; and
wherein a bottom surface of the bridge portion is located within a horizontal plane overlying a topmost surface of the alternating stack.

17. The monolithic three-dimensional memory device of claim 10, wherein each memory stack structure extends through the alternating stack and comprises, from outside to inside:
at least one blocking dielectric,
a memory material layer,
a tunneling dielectric, and
a vertical semiconductor channel contacting an overlying drain region.

18. The monolithic three-dimensional memory device of claim 17, further comprising a retro-stepped dielectric material portion having a sidewall that contacts a plurality of electrically conductive layers within the alternating stack, and source regions underlying the backside contact via structures and located in, or on, the substrate;
wherein a semiconductor channel contiguously extends between each drain region and one of the source regions; and
wherein backside contact via structures comprise source electrodes or source side local interconnects.

* * * * *